United States Patent
Ohno et al.

(10) Patent No.: US 11,365,482 B2
(45) Date of Patent: Jun. 21, 2022

(54) SUBSTRATE PROCESSING APPARATUS AND METHOD OF MANUFACTURING SEMICONDUCTOR DEVICE

(71) Applicant: KOKUSAI ELECTRIC CORPORATION, Tokyo (JP)

(72) Inventors: Mikio Ohno, Toyama (JP); Atsushi Umekawa, Toyama (JP); Takeo Hanashima, Toyama (JP); Hiroaki Hiramatsu, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/833,014

(22) Filed: Mar. 27, 2020

(65) Prior Publication Data
US 2020/0232097 A1 Jul. 23, 2020

Related U.S. Application Data

(60) Division of application No. 16/213,568, filed on Dec. 7, 2018, now Pat. No. 10,640,872, which is a
(Continued)

(51) Int. Cl.
*C23C 16/52* (2006.01)
*H01L 21/67* (2006.01)
(Continued)

(52) U.S. Cl.
CPC ............ *C23C 16/52* (2013.01); *C23C 16/345* (2013.01); *C23C 16/44* (2013.01);
(Continued)

(58) Field of Classification Search
CPC ............... C23C 16/46; C23C 16/4401; C23C 16/4409; C23C 16/52; H01L 21/02164;
(Continued)

(56) References Cited

U.S. PATENT DOCUMENTS

| 5,443,540 A | 8/1995 | Kamikaza |
| 7,682,843 B2 * | 3/2010 | Moriya ................. C23C 16/455 438/10 |
| 8,122,850 B2 * | 2/2012 | Hishiya ............ H01L 21/02337 118/696 |

(Continued)

FOREIGN PATENT DOCUMENTS

| JP | 07-283164 A | 10/1995 |
| JP | 11-186248 A | 7/1999 |

(Continued)

OTHER PUBLICATIONS

Korean Office Action dated Apr. 16, 2020 for the Korean Patent Application No. 10-2018-7034914.

(Continued)

*Primary Examiner* — Vu A Vu
(74) *Attorney, Agent, or Firm* — Volpe Koenig

(57) ABSTRACT

There is provided a substrate processing apparatus including a process chamber defined at least by a reaction tube and a furnace opening part provided at a lower portion of the reaction tube; a nozzle provided at the furnace opening part and extending from the furnace opening part to an inside of the reaction tube; a gas supply system provided at an upstream side of the nozzle; a blocking part provided at a boundary between the gas supply system and the nozzle; and a controller configured to control the gas supply system and the blocking part such that the blocking part co-operates with the gas supply system to supply gases into the process chamber through the nozzle.

11 Claims, 13 Drawing Sheets

Related U.S. Application Data continuation of application No. PCT/JP2016/066915, filed on Jun. 7, 2016.

(51) Int. Cl.
  *C23C 16/44* (2006.01)
  *C23C 16/34* (2006.01)
  *C23C 16/455* (2006.01)
  *C23C 16/46* (2006.01)
  *H01L 21/02* (2006.01)
  *H01L 21/673* (2006.01)

(52) U.S. Cl.
  CPC ...... *C23C 16/45563* (2013.01); *C23C 16/463* (2013.01); *H01L 21/02271* (2013.01); *H01L 21/67017* (2013.01); *H01L 21/67109* (2013.01); *H01L 21/67393* (2013.01)

(58) Field of Classification Search
  CPC ......... H01L 21/02222; H01L 21/02271; H01L 21/02282; H01L 21/02326; H01L 21/02337
  USPC ........................................................ 438/778
  See application file for complete search history.

(56) References Cited

U.S. PATENT DOCUMENTS

| | | | |
|---|---|---|---|
| 9,080,238 B2* | 7/2015 | Wamura | C23C 16/4402 |
| 10,640,872 B2* | 5/2020 | Ohno | H01L 21/02271 |
| 2007/0028838 A1 | 2/2007 | Bercaw et al. | |
| 2010/0136260 A1* | 6/2010 | Matsunaga | C23C 16/45542 427/569 |
| 2010/0297846 A1* | 11/2010 | Kaga | C23C 16/45544 438/680 |
| 2013/0084712 A1 | 4/2013 | Yuasa et al. | |
| 2013/0164943 A1* | 6/2013 | Koshi | H01L 21/67028 438/758 |
| 2014/0094027 A1 | 4/2014 | Azumo et al. | |
| 2015/0206736 A1 | 7/2015 | Akae et al. | |

FOREIGN PATENT DOCUMENTS

| | | |
|---|---|---|
| JP | 2000-204472 A | 7/2000 |
| JP | 2004-023043 A | 1/2004 |
| JP | 2005-285922 A | 10/2005 |
| JP | 2009-503875 A | 1/2009 |
| JP | 2011-187485 A | 9/2011 |
| JP | 2014-075451 A | 4/2014 |
| JP | 2015-138913 A | 7/2015 |
| KR | 20070016071 A | 2/2007 |
| KR | 20140043879 A | 4/2014 |

OTHER PUBLICATIONS

Japanese Office Action dated May 8, 2019 for the Japanese Patent Application No. 2018-522204.

* cited by examiner

FIG. 11

| NUMBER OF CYCLES | | 3 | | | | 2 | | | | 4 | | |
|---|---|---|---|---|---|---|---|---|---|---|---|---|
| STEP | PRE-PURGE | SOURCE GAS SUPPLY | SOURCE GAS EXHAUST | POST-PURGE | GAS PURGING (FIRST) | GAS PURGING (SECOND) | REACTIVE GAS SUPPLY | REACTIVE GAS EXHAUST | GAS PURGING (FIRST) | GAS PURGING (SECOND) | POST-PURGE |
| TIME(sec) | 2 | 2 | 1 | 1 | 1 | 1 | 9 | 1 | 1 | 1 | 7 |
| SOURCE GAS(slm) | 0 | HCDS:0.4 | 0 | 0 | $N_2$:1 | $N_2$:0.5 | 0 | 0 | $N_2$:1 | $N_2$:0.5 | $N_2$:0.5 |
| REACTIVE GAS(slm) | $N_2$:0.1 | 0 | 0 | 0 | $N_2$:1 | $N_2$:0.5 | $NH_3$:5.5 | 0 | $N_2$:1 | $N_2$:0.5 | $N_2$:0.5 |
| SECOND SHUT OFF VALVE(101b) | CLOSED | OPEN | CLOSED | OPEN | OPEN | OPEN | CLOSED | CLOSED | OPEN | OPEN | OPEN |
| FIRST SHUT OFF VALVE(101a) | OPEN | CLOSED | CLOSED | OPEN | OPEN | OPEN | OPEN | CLOSED | OPEN | OPEN | OPEN |

FIG. 12

| COUNTER N$_2$ GAS | | WITH COUNTER N$_2$ GAS | WITH COUNTER N$_2$ GAS | W/O COUNTER N$_2$ GAS |
|---|---|---|---|---|
| | N$_2$ [slm] | 0.5 | 0.1 | 0 |
| TOP | AVERAGE FILM THICKNESS [Å] | 72.5 | 75.6 | 83.0 |
| | UNIFORMITY IN WAFER [±%] | 1.36 | 0.99 | 0.81 |
| CNT | AVERAGE FILM THICKNESS [Å] | 71.0 | 74.9 | 83.0 |
| | UNIFORMITY IN WAFER [±%] | 1.37 | 1.18 | 0.77 |
| BTM | AVERAGE FILM THICKNESS [Å] | 65.4 | 71.6 | 82.8 |
| | UNIFORMITY IN WAFER [±%] | 1.32 | 1.17 | 0.90 |
| UNIFORMITY BETWEEN WAFERS [±%] | | 5.10 | 2.66 | 0.12 |

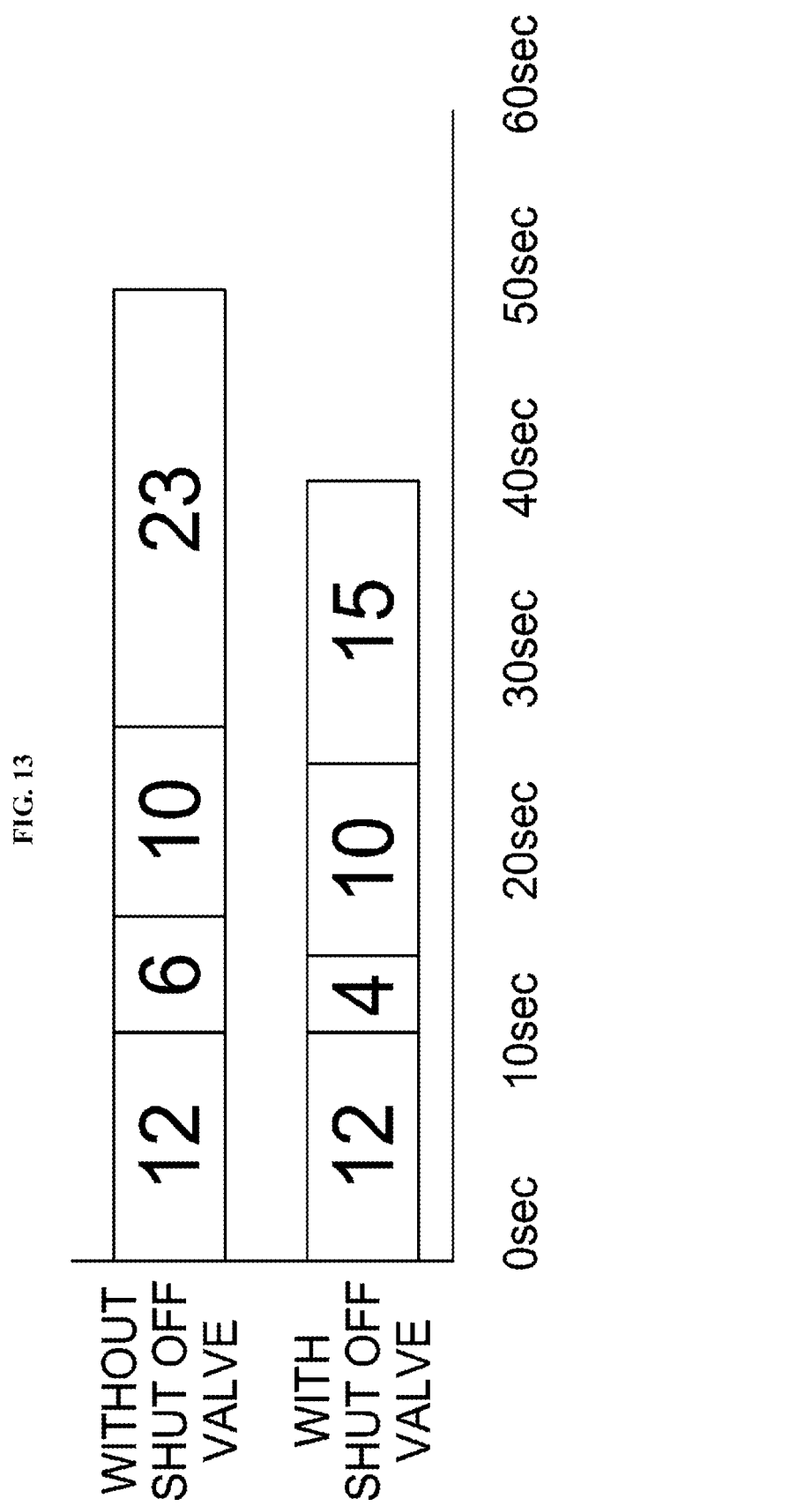

SUBSTRATE PROCESSING APPARATUS AND METHOD OF MANUFACTURING SEMICONDUCTOR DEVICE

CROSS-REFERENCE TO RELATED PATENT APPLICATION

This non-provisional U.S. patent application is a divisional of and claims priority to U.S. patent application Ser. No. 16/213,568 filed on Dec. 7, 2018 which claims priority under 35 U.S.C. § 119 of International Application No. PCT/JP2016/066915, filed on Jun. 7, 2016, in the WIPO, the entire contents of which are hereby incorporated by reference.

BACKGROUND

1. Field

The present disclosure relates to a substrate processing apparatus and a method of manufacturing a semiconductor device.

2. Description of the Related Art

A semiconductor manufacturing apparatus is an example of a substrate processing apparatus. As the semiconductor manufacturing apparatus, for example, a vertical type apparatus (also referred to as a "vertical type semiconductor manufacturing apparatus") may be used. Recently, in order to form various films, the semiconductor manufacturing apparatus of the vertical type may include a plurality of opening/closing valves and a gas supply system including two or more gas supply mechanisms. In general, as shown in FIG. 4, the semiconductor manufacturing apparatus includes a piping including a flexible pipe. The flexible pipe is used for the piping provided from a furnace opening part to an opening/closing valve closest thereto. Although the length of the flexible pipe varies depending on the layout of the substrate processing apparatus, the length of the flexible pipe was about 500 mm to 3,000 mm.

Particles originated from by-products adhered to such piping including the flexible pipe provided from the furnace opening part to the opening/closing valve closest thereto may be discharged into a reaction tube of the substrate processing apparatus. When the discharged particles adhere to a substrate, the characteristics of a semiconductor device may be affected. Therefore, in order to prevent the above-described problem, while supplying a film-forming gas into the piping, $N_2$ gas is simultaneously supplied into another piping where the film-forming gas is not supplied. However, by supplying the $N_2$ gas (hereinafter, also referred to as "counter $N_2$ gas"), the concentration of the film-forming gas becomes non-uniform in the reaction tube. Therefore, the uniformity of film thickness may deteriorate in a substrate processing.

As a configuration for eliminating the need for the counter $N_2$ gas, an opening/closing valve may be installed at a pipe of the gas supply system close to a process furnace of the substrate processing apparatus. However, it is difficult to install the opening/closing valve at the pipe of the gas supply system close to the process furnace for the reasons such as the restriction of the space for installing the valve and the limit of the heat resistant temperature of the valve. According to some related arts, a valve may be installed at a pipe close to the furnace opening part. However, a configuration for eliminating the need for the counter $N_2$ gas is not disclosed in the related arts.

SUMMARY

Described herein is a technique capable of providing an opening/closing valve in the vicinity of a furnace opening part.

According to one aspect of the technique described herein, there is provided a method of manufacturing a semiconductor device, including:

(a) loading a substrate retainer accommodating a plurality of wafers into a reaction tube; and (b) processing the plurality of wafers by supplying a gas into the reaction tube through a nozzle by controlling a gas supply system to co-operate with a blocking part and a switching part such that the gas flows from the gas supply system to the blocking part via the switching part, wherein the nozzle extends from an inner wall of a furnace opening part to an inside of the reaction tube, the blocking part is connected to the nozzle, and the gas supply system is provided at an upstream side of the nozzle and is connected to the switching part.

BRIEF DESCRIPTION OF THE DRAWINGS

FIG. 11 is a diagram showing an exemplary flow of a substrate processing for supplying process gases by operating the shut off valve preferably used in the embodiments.

FIG. 12 is a diagram showing results of the substrate processing obtained by supplying the process gases by operating the shut off valve preferably used in the embodiments.

FIG. 13 is a diagram showing a comparison result between the substrate processing with and without the shut off valve using a film-forming sequence preferably used in the embodiments.

DETAILED DESCRIPTION

<Embodiments>

A substrate processing apparatus according to one or more embodiments of the technique is configured as an example of a semiconductor manufacturing apparatus used for manufacturing a semiconductor device. Specifically, the substrate processing apparatus includes a process chamber defined at least by a reaction tube and a furnace opening part provided at a lower portion of the reaction tube; a nozzle provided at the furnace opening part and extending from the furnace opening part to an inside of the reaction tube; a process gas supply system provided at an upstream side of the nozzle; a blocking part provided at a boundary between the process gas supply system and the nozzle; and a controller configured to control the process gas supply system and the blocking part such that the blocking part co-operates with the process gas supply system to supply gases into the process chamber through the nozzle.

The blocking part connected to the nozzle extending from an inner wall of the furnace opening part to the inside of the reaction tube is provided at the furnace opening part without providing a pipe between the blocking part and an outer wall of the furnace opening part. In this configuration, the blocking part is installed almost directly under a process furnace (in the vicinity of the furnace opening part). Thus, it is preferable to provide a cooling mechanism so that the shut off valve (blocking part) can be cooled. In addition, as a countermeasure against the heat buildup in the furnace opening part, it is preferable to provide a furnace opening exhaust mechanism capable of performing local exhaust of the furnace opening part. The cooling mechanism may be also referred to as a "cooling part". The cooling mechanism and the furnace opening exhaust mechanism will be described later.

In the embodiments, a structure in which the furnace opening part and the shut off valve are integrated as a united body (for example, no piping including a flexible pipe is provided between the furnace opening part and the shut off valve) may also be simply referred to as a "furnace opening part".

Figure 1:
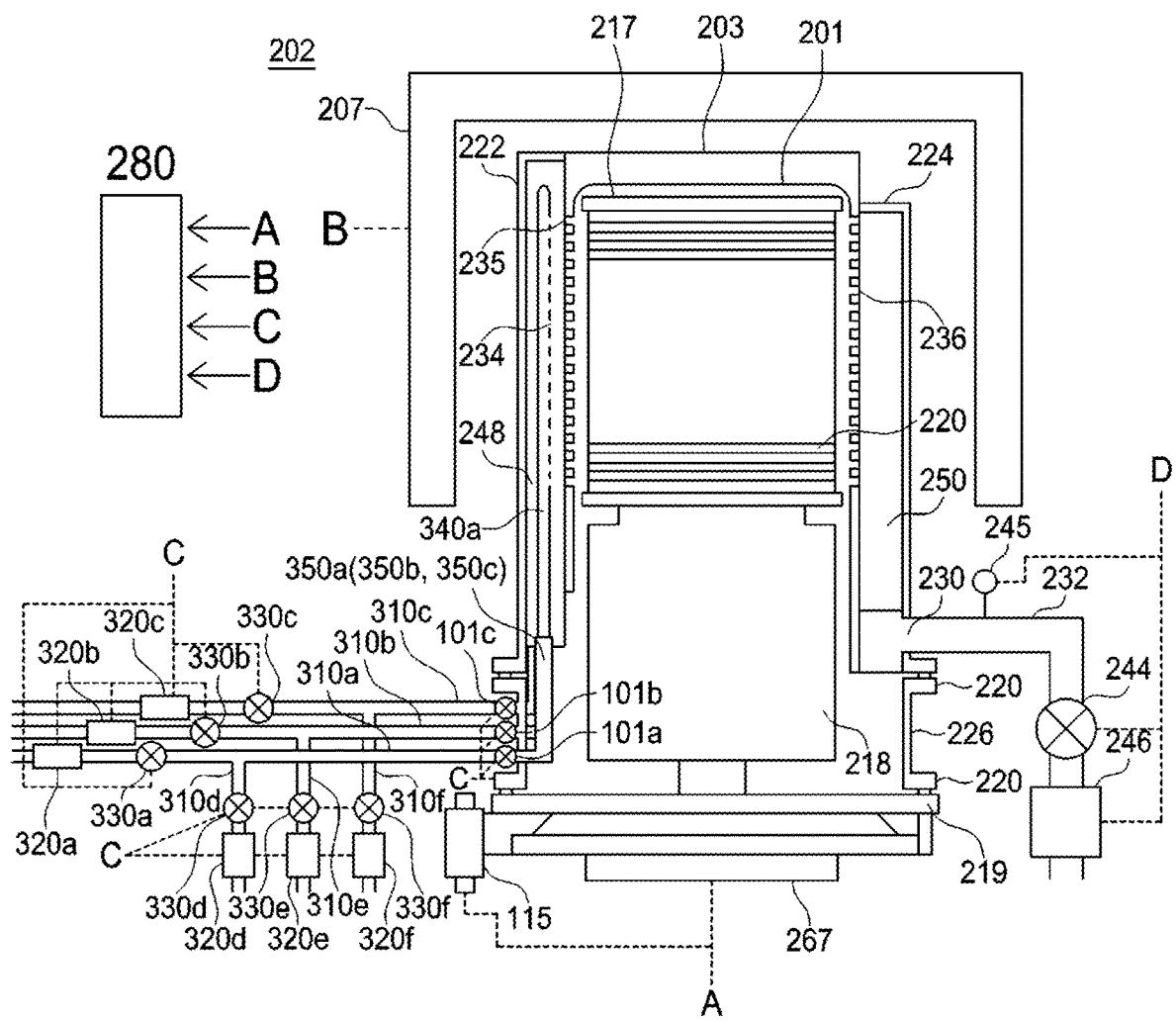
FIG. 1 schematically illustrates a vertical cross-section of a process furnace of a substrate processing apparatus preferably used in one or more embodiments described herein.

Hereinafter, the embodiments according to the technique will be described with reference to figures such as FIG. 1 and FIG. 2. First, as shown in FIG. 1, a process furnace 202 includes a heater 207 serving as a heating apparatus (heating mechanism). The heater 207 is cylindrical, and includes a heater wire (not shown) and a heat insulating material (not shown). A lower portion of the heater 207 is supported by a heater base (not shown) serving as a support plate, so that the heater 207 is installed in a vertical orientation. In addition, the heater 207 also functions as an activation mechanism (excitation mechanism) for activating (exciting) process gases by heat.

A reaction tube 203 having a single tube structure and constituting a reaction vessel (process vessel) is provided in the heater 207 so as to be concentric with the heater 207. The reaction tube 203 is made of a heat-resistant material such as quartz ($SiO_2$) and silicon carbide (SiC). A lower end of the reaction tube 203 is open, and an upper end of the reaction tube 203 is constituted by a ceiling closed by a flat wall. The upper end of the reaction tube 203 (hereinafter, also referred to as a "ceiling portion") is formed thick to secure the strength of the reaction tube 203. A side wall of the reaction tube 203 is constituted by a cylindrical portion formed in a cylindrical shape, and a gas supply region 222 and a gas exhaust region 224 are provided on an outer wall of the cylindrical portion. A process chamber 201 is provided in the reaction tube 203 including the gas supply region 222 and the gas exhaust region 224. The process chamber 201 is defined by the reaction tube 203 and a furnace opening part which will be described later. The process chamber 201 is configured such that wafers 200 serving as substrates are processed therein, and accommodates a boat 217 capable of supporting vertically arranged wafers 200 in a horizontal orientation in a multistage manner. The heater 207 is provided so as to surround the reaction tube 203. The heater 207 can heat the wafers 200 accommodated in the boat 217 in the reaction tube 203 (or in the process chamber 201) to a predetermined temperature. The boat 217 serves as a substrate retainer.

The gas supply region 222 is constituted by a protruding portion protruding outward from a sidewall of the cylindrical portion of the reaction tube 203. An outer wall of the gas supply region 222 is located outer than a part of the cylindrical portion of the reaction tube 203, and is concentrical with the cylindrical portion with a diameter larger than an outer diameter of the cylindrical portion. A lower end of the gas supply region 222 is open, and an upper end of the gas supply region 222 is constituted by a ceiling closed by a flat wall. Nozzle parts 340a, 340b and 340c which will be described later are accommodated in the gas supply region 222 along the longitudinal direction (that is, vertical direction). Gas supply slits 235 are provided at a partition wall 254 which is arranged along a boundary between the gas supply region 222 and the cylindrical portion. The partition wall 254 may be referred to a side wall of the cylindrical portion. An outer side surface of the partition wall 254 constitutes a side portion facing the gas supply region 222. Hereinafter, for example, the nozzle parts 340a through 340c may be collectively referred to as a nozzle part 340. The same also applies to other components described herein such as a blocking part 101. That is, blocking parts 101a, 101b and 101c may be collectively referred to as the blocking part 101.

The gas exhaust region 224 is constituted by a protruding portion protruding outward from a sidewall of the cylindrical portion at a region other than where the gas supply region 222 is provided. The wafers 200 of the process chamber 201 are accommodated in a region between the gas supply region 222 and the gas exhaust region 224. An outer wall of the gas exhaust region 224 is provided concentrically with the cylindrical portion, and is located outer than the cylindrical portion with a diameter larger than the outer diameter of the cylindrical portion. A lower end of the gas exhaust region 224 and an upper end of the gas exhaust region 224 are constituted by ceilings closed by flat walls. Gas exhaust slits 236 are provided at a partition wall 252 arranged along a boundary between the gas exhaust region 224 and the cylindrical portion. The partition wall 252 may be referred to a side wall of the cylindrical portion. An outer side surface of the partition wall 252 constitutes a side portion facing the gas exhaust region 224.

The lower end of the reaction tube 203 is supported by a cylindrical manifold 226 serving as the furnace opening part. The manifold 209 is made of a metal such as a nickel alloy and stainless steel (SUS), or is made of a heat resistant material such as quartz ($SiO_2$) and silicon carbide (SiC). A flange (not shown) is provided at an upper end of the manifold 226. The lower end of the reaction tube 203 is provided on the flange and supported by the flange. A sealing member 220 such as an O-ring is provided between the flange and the lower end of the reaction tube 203 to airtightly seal the inside of the reaction tube 203.

A seal cap 219 is airtightly attached to a lower end opening of the manifold 226 via a sealing member 220 such as an O-ring. The seal cap 219 is configured to airtightly seal a lower end opening of the reaction tube 203, that is, the lower end opening of the manifold 226. For example, the seal cap 219 is made of a metal such as a nickel alloy or stainless steel, and is disc-shaped.

A boat support 218 configured to support the boat 217 is provided on the seal cap 219. The boat support 218 is made of a heat-resistant material such as quartz and silicon carbide. The boat support 218 functions as a heat insulating part. The boat support 218 also serves as a support body for supporting the boat 217. The boat 217 includes a bottom plate (not shown) fixed to the boat support 218 and a top plate (not shown) provided above the bottom plate. A plurality of support columns (not shown) are provided between the bottom plate and the top plate. For example, the boat 217 is made of a heat resistant material such as quartz or silicon carbide.

A boat rotating mechanism 267 to rotate the boat 217 is provided under the seal cap 219 opposite to the process chamber 201. A rotating shaft (not shown) of the boat rotating mechanism 267 is connected to the boat 217 through the seal cap 219. As the boat rotating mechanism 267 rotates the boat 217 via the boat support 218, the wafers 200 supported by the boat 217 are rotated. The seal cap 219 may be moved upward/downward in the vertical direction by a boat elevator 115 provided outside the reaction tube 203. The boat elevator 115 serves as an elevating mechanism. As the seal cap 219 is moved upward/downward by the boat elevator 115, the boat 217 is loaded into the process chamber 201 or unloaded out of the process chamber 201.

A nozzle support part 350 for supporting the nozzle part 340 is provided in the manifold 226. The nozzle support part 350 is L-shaped and provided through a side wall of the manifold 226. In the embodiments, for example, three nozzle support parts 350a, 350b and 350c serving as the nozzle support part 350 are provided. The nozzle support part 350 is made of a material such as a nickel alloy and stainless steel. A gas supply pipe 310 for supplying a gas into the reaction tube 203 is connected to an end of the nozzle support part 350 on the side of the reaction tube 203 via the blocking part 101 serving as a shut off valve. In the embodiments, the blocking part 101 may also be referred to as a shut off valve 101.

The nozzle parts 340a, 340b and 340c are connected to the other ends of the nozzle support parts 350a, 350b and 350c, respectively. For example, the nozzle part 340 is made of a heat resistant material such as quartz and SiC. A nozzle is constituted by the nozzle support part 350 and the nozzle part 340. A shut off valve 101 provided at the boundary between the nozzle and the gas supply pipe 310 is fixed in the vicinity of the manifold 226. In addition, the nozzle may be configured such that the nozzle support part 350 and the nozzle part 340 are integrated.

The nozzle part 340 is provided in the gas supply region 222. The nozzle part 340 extends from a lower portion to an upper portion of the gas supply region 222 along the longitudinal direction of the gas supply region 222 (that is, vertical direction). For example, the nozzle parts 340a and 340c are I-shaped long nozzle, respectively. A plurality of gas supply holes 234a and a plurality of gas supply holes 234c for supplying gases are provided at side surfaces of the nozzle parts 340a and 340c, respectively. The plurality of gas supply holes 234a and the plurality of gas supply holes 234c are open toward the center of the reaction tube 203. For example, the nozzle part 340b is I-shaped short pipe nozzle (that is, I-shaped short nozzle). The nozzle part 340b is provided with an opening portion 234b, and a front end of the nozzle part 340b is open. As described above, for example, three nozzle portions 340a through 340c are provided in the gas supply region 222 and are configured to supply various types of gases into the process chamber 201. The nozzle part 340 may be, for example, I-shaped or L-shaped, but the shape of the nozzle part 340 is not limited thereto.

The boat 217 accommodating the wafers 200 to be batch-processed is loaded into the process chamber 201 of the above-described process furnace 202 while being supported by the boat support 218. The wafers 200 are accommodated in the boat 217 in a multistage manner. The heater 207 is configured to heat the wafers 200 loaded in the process chamber 201 to a predetermined temperature.

A first gas supply source (not shown) for supplying a first process gas (also referred to as a "first gas"), a mass flow controller (MFC) 320a serving as a flow rate controller (flow rate control mechanism) and a valve 330a serving as an opening/closing valve are sequentially provided at a gas supply pipe 310a from the upstream side toward the downstream side of the gas supply pipe 310a. A shut off valve 101a is provided at a boundary between the gas supply pipe 310a and the nozzle support part 350a. The shut off valve 101a is installed in the vicinity of the outside of the manifold 226. For example, the manifold 226 and the shut off valve 101a are integrally provided without providing a flexible pipe between the manifold 226 and the shut off valve 101a. In addition, an exhaust part 102a which will be described later may be provided so as to be adjacent to the shut off valve 101a.

A second gas supply source (not shown) for supplying a second process gas (also referred to as a "second gas"), a mass flow controller (MFC) 320b serving as a flow rate controller (flow rate control mechanism) and a valve 330b serving as an opening/closing valve are sequentially provided at a gas supply pipe 310b from the upstream side toward the downstream side of the gas supply pipe 310b. A shut off valve 101b is provided at a boundary between the gas supply pipe 310b and the nozzle support part 350b. The shut off valve 101b is installed in the vicinity of the outside of the manifold 226. For example, the manifold 226 and the shut off valve 101b are integrally provided without providing a flexible pipe between the manifold 226 and the shut off valve 101b. In addition, an exhaust part 102b which will be described later may be provided so as to be adjacent to the shut off valve 101b.

A third gas supply source (not shown) for supplying a third process gas (also referred to as a "third gas"), a mass flow controller (MFC) 320c serving as a flow rate controller (flow rate control mechanism) and a valve 330c serving as an opening/closing valve are sequentially provided at a gas supply pipe 310c from the upstream side toward the downstream side of the gas supply pipe 310c. A shut off valve 101c is provided at a boundary between the gas supply pipe 310c and the nozzle support part 350c. The shut off valve 101c is installed in the vicinity of the outside of the manifold 226. For example, the manifold 226 and the shut off valve 101c are integrally provided without providing a flexible pipe between the manifold 226 and the shut off valve 101c. In addition, an exhaust part 102c which will be described later may be provided so as to be adjacent to the shut off valve 101c.

Gas supply pipes 310d, 310e and 310f are connected to the downstream sides of the valves 330a, 330b and 330c provided at the gas supply pipes 310a, 310b and 310c, respectively. Mass flow controllers (MFCs) 320d, 320e and 320f serving as flow rate controllers (flow rate control mechanisms) and valves 330d, 330e and 330f serving as opening/closing valves are sequentially provided at the gas supply pipes 310d, 310e and 310f from the upstream sides toward the downstream sides of the gas supply pipes 310d, 310e and 310f, respectively.

A first process gas supply system is constituted mainly by the gas supply pipe 310a, the MFC 320a and the valve 330a. In the present specification, the first process gas supply system may be also referred to as a first process gas supply mechanism. The first process gas supply system may further include the first gas supply source, the nozzle support part 350a, the nozzle part 340a and the shut off valve 101a. The first process gas supply system may be constituted by a first piping part including the gas supply pipe 310a, the MFC 320a and the valve 330a; a first boundary part including at least the first blocking part 101a; and a first nozzle constituted by at least the nozzle support part 350a and the nozzle part 340a. For example, according to the embodiments, the first process gas serving as a reactive gas is supplied through the first process gas supply system.

A second process gas supply system is constituted mainly by the gas supply pipe 310b, the MFC 320b and the valve 330b. In the present specification, the second process gas supply system may be also referred to as a second process gas supply mechanism. The second process gas supply system may further include the second gas supply source, the nozzle support part 350b, the nozzle part 340b and the shut off valve 101b. The second process gas supply system may be constituted by a second piping part including the gas supply pipe 310b, the MFC 32b and the valve 330b; a second boundary part including at least the second blocking part 101b; and a second nozzle constituted by at least the nozzle support part 350b and the nozzle part 340b. For example, according to the embodiments, the second process gas serving as a source gas is supplied through the second process gas supply system.

A third process gas supply system is constituted mainly by the gas supply pipe 310c, the MFC 320c and the valve 330c. In the present specification, the third process gas supply system may be also referred to as a third process gas supply mechanism. The third process gas supply system may further include the third gas supply source, the nozzle support part 350c, the nozzle part 340c and the shut off valve 101c. The third process gas supply system may be constituted by a third piping part including the gas supply pipe 310c, the MFC 320c and the valve 330c; a third boundary part including at least the third blocking part 101c; and a third nozzle constituted by at least the nozzle support part 350c and the nozzle part 340c. For example, according to the embodiments, the third process gas is supplied through the third process gas supply system. The third process gas serves as a reactive gas or an inert gas that does not contribute to a substrate processing. The configurations of the process gas supply systems and the shut off valve 101 will be described later.

In the present specification, the term "process gas" may indicate only the first process gas, indicate only the second process gas, indicate only the third process gas, or indicate all of the first process gas, the second process gas and the third process gas. In addition, in the present specification, the term "process gas supply system" may indicate only the first process gas supply system (first process gas supply mechanism), indicate only the second process gas supply system (second process gas supply mechanism), indicate only the third process gas supply system (third process gas supply system), or indicate all of the first process gas supply system, the second process gas supply system and the third process gas supply system. In the present specification, the process gas supply system may be simply referred to as a "gas supply system".

An exhaust port 230 is provided under the gas exhaust region 224. The exhaust port 230 is connected to an exhaust pipe 232. A vacuum pump 246 serving as a vacuum exhauster is connected to the exhaust pipe 232 through a pressure sensor 245 and an APC (Automatic Pressure Controller) valve 244. The pressure sensor 245 serves as a pressure detector (pressure detection mechanism) to detect an inner pressure of the process chamber 201, and the APC valve 244 serves as an pressure controller (pressure adjusting mechanism). The vacuum pump 246 is configured to vacuum-exhaust the inside of the process chamber 201 such that the inner pressure of the process chamber 201 reaches a predetermined pressure (vacuum degree). The APC valve 244 includes an opening/closing valve. With the vacuum pump 246 in operation, the APC valve 244 may be opened/closed to vacuum-exhaust the process chamber 201 or stop the vacuum exhaust. With the vacuum pump 246 in operation, by adjusting an opening degree of the APC valve 244, the APC valve 244 is configured to adjust the inner pressure of the process chamber 201 by adjusting the conductance. An exhaust system is constituted mainly by the exhaust pipe 232, the APC valve 244 and the pressure sensor 245. The exhaust system may further include the vacuum pump 246.

By executing a process recipe describe later, a controller 280 which will be described later is configured to control: (A) a transfer system including components such as the boat elevator 115 and the boat rotating mechanism 267; (B) a temperature control system including components such as the heater 207; (C) the process gas supply system including components such as the MFC 320, the valves 330 and the blocking part 101; and (D) a gas exhaust system including components such as the APC valve 244 and the pressure sensor 245.

Figure 2:
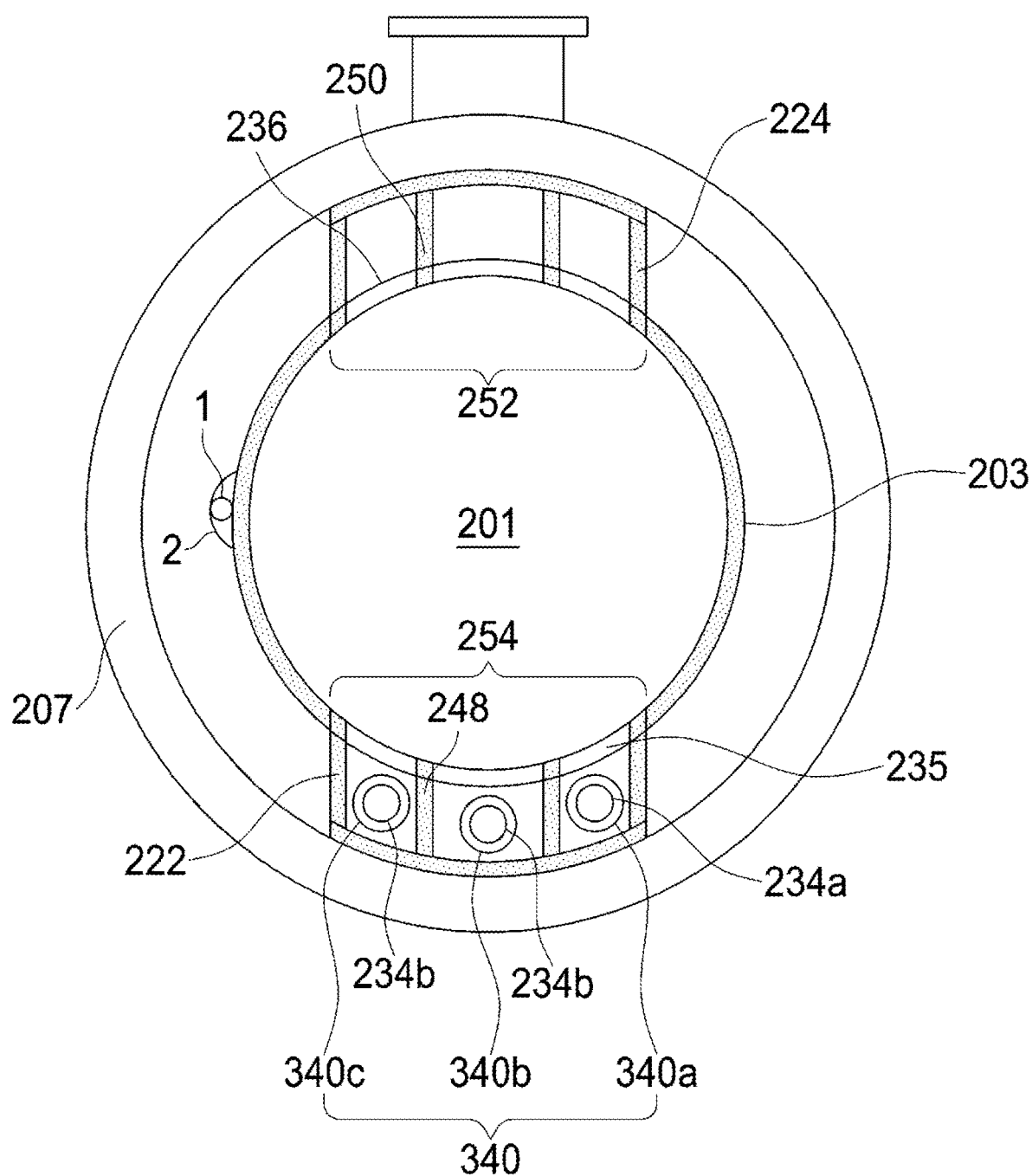
FIG. 2 schematically illustrates a horizontal cross-section of a reaction tube of the substrate processing apparatus preferably used in the embodiments.

As shown in FIG. 2, a temperature sensor 1 (hereinafter, also referred to as a "thermocouple") serving as a temperature detector is provided at the outside the reaction tube 203. The power supplied to the heater 207 is adjusted based on the temperature detected by the temperature sensor 1 such that the inner temperature of the process chamber 201 has a desired temperature distribution.

As shown in FIG. 2, the thermocouple 1 is attached to the outside of the reaction tube 203 via a cover 2 serving as a protective part. For example, the cover 2 is made of quartz. According to the embodiments, the thermocouple 1 is attached to the outside of the process chamber 201 and provided so as to face the heater 207 serving as a heating apparatus. For example, the thermocouple 1 is fixed by the reaction tube 203 and the cover 2.

In FIG. 2, only one thermocouple 1 is shown. However, a plurality of thermocouples 1 may be provided. In addition, it is possible to provide a buffer part (not shown) between the thermocouple 1 and the reaction tube 203. Further, although the thermocouple 1 shown FIG. 2 is provided on the side wall of the reaction tube 203, the thermocouple 1 may be provided on the ceiling portion of the reaction tube 203.

Figure 5:
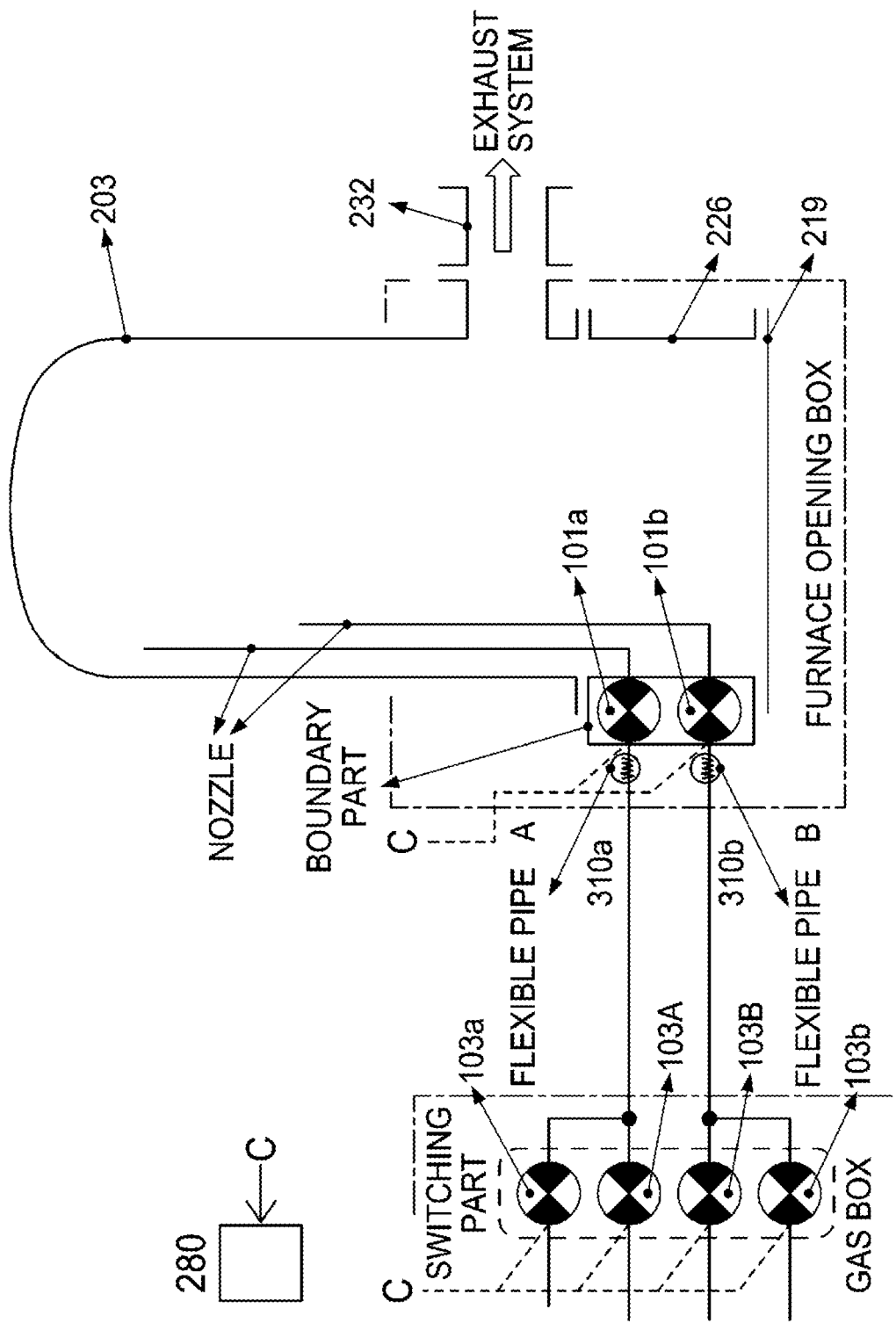
FIG. 5 schematically illustrates an exemplary configuration of blocking parts, gas supply pipes and nozzles preferably used in the embodiments.
Figure 6:
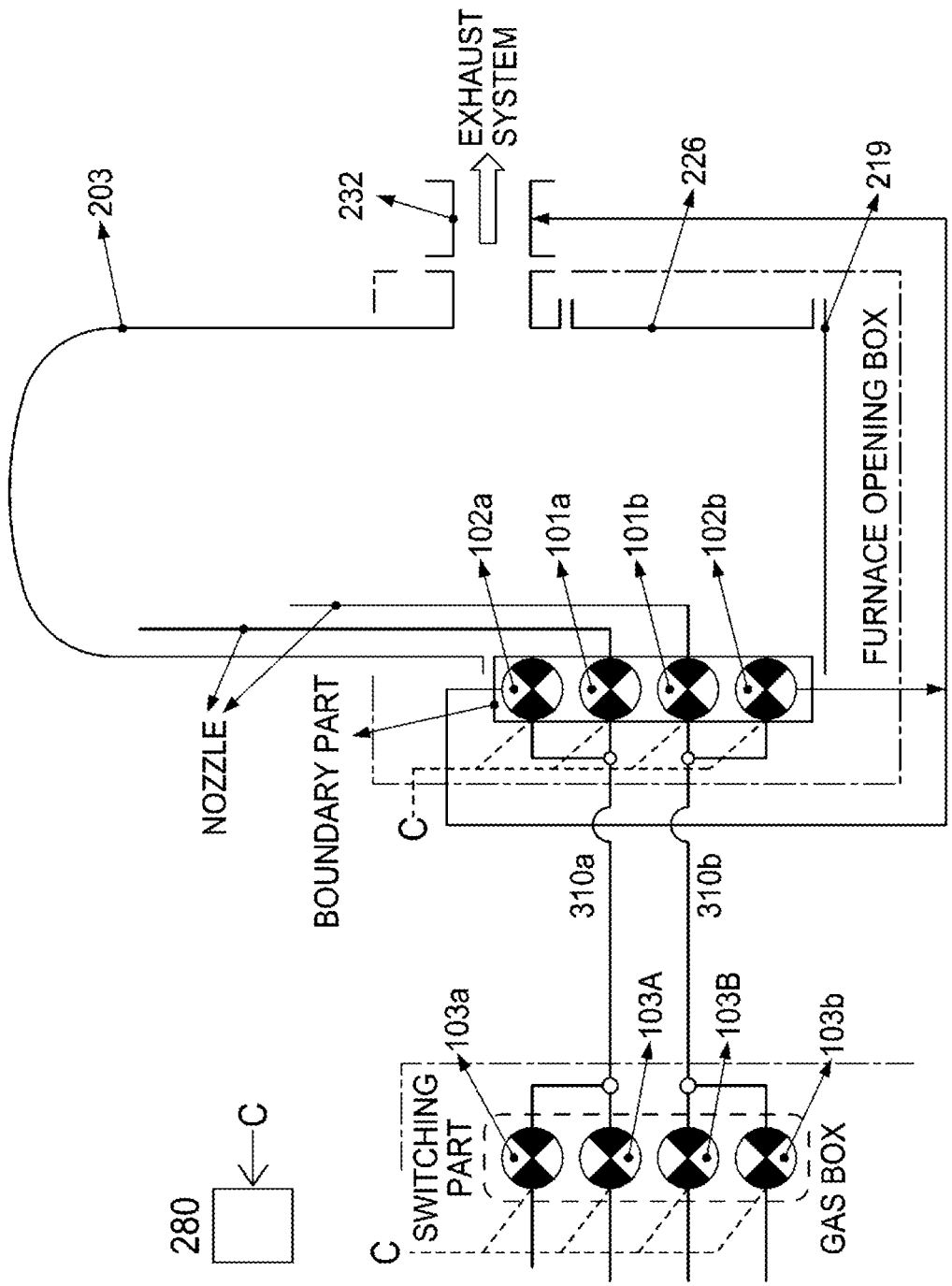
FIG. 6 schematically illustrates another exemplary configuration of blocking parts, gas supply pipes and nozzles preferably used in the embodiments.

FIGS. 5 and 6 are schematic diagrams for describing the process gas supply system according to the embodiments. In FIGS. 5 and 6, only two of the process gas supply systems (i.e., the first process gas supply system and the second process gas supply system) are illustrated in order to help understanding the relationship among the gas supply pipe 310, a boundary part (the shut off valve 101) and the nozzle. By executing the process recipe describe later, the controller 280 which will be described later is configured to control: (C) the process gas supply system, the blocking part 101, the exhaust part 102 and the switching part 103. The components of the process gas supply system such as the process gas supply sources, the MFC 320 and the valve 330 are provided on the upstream side of the switching part (switching valve) 103. However, the components are omitted in FIGS. 5 and 6 for simplification. The exhaust part 102 may also be referred to as an exhaust valve 102.

A valve (switching valve) closest to the furnace opening part 226 in a gas box is a valve that switches between a gas contributing to the substrate processing (such as process gas) and a cleaning gas. The components of the process gas supply system and a cleaning gas supply system (not shown) are provided on the upstream side of the switching part (switching valve) 103.

According to the embodiments, the gas supply system includes the gas supply pipe 310. The nozzles extend from the furnace opening part 226 to the inside of the reaction tube 203, and the boundary part includes at least the blocking part 101. The switching part (switching valve) 103 is configured to switch between the gas contributing to the substrate processing (such as the process gas) and the cleaning gas, and is provided at the gas supply pipe 310. The boundary part is connected to the gas supply pipe 310. It is preferable to provide the exhaust part 102 for exhausting a piping including the gas supply pipe 310 between the switching part 103 and the blocking part 101.

Preferably, the substrate processing apparatus may include: the nozzles (the first nozzle and the second nozzle) extending from the furnace opening part 226 to the inside of the reaction tube 203; the first process gas supply system including at least the gas supply pipe 310a provided at the upstream side of the nozzle (the first nozzle); a second process gas supply system including at least the gas supply pipe 310b provided at the upstream side of the nozzle (the second nozzle); the first blocking part 101a provided at a boundary between the first nozzle and the first process gas supply system; and the second blocking part 101b provided at a boundary between the second nozzle and the second process gas supply system. The reactive gas serving as the first process gas is supplied into the reaction tube 203 by controlling the first blocking part 101a to co-operate with the first process gas supply system, and the source gas serving as the second process gas is supplied into the reaction tube 203 by controlling the second blocking part 101b to co-operate with the second process gas supply system. The above-described components such as the first process gas supply system, the first blocking part 101a, the second process gas supply system and the second blocking part 101b are controlled by the controller 280 shown in FIGS. 5 and 6.

As described above, the boundary part including the shut off valve (blocking part) 101 is provided. By opening the shut off valve 101a and closing the shut off valve 101b, the gas supply pipe 310b and the inside of the reaction tube 203 can be blocked when the first process gas is supplied through the gas supply pipe 310a and the first nozzle. Thus, it is possible to suppress the back diffusion of the first process gas into the gas supply pipe 310b. In addition, by opening the shut off valve 101b and closing the shut off valve 101a, the gas supply pipe 310a and the inside of the reaction tube 203 can be blocked when the second process gas is supplied through the gas supply pipe 310b and the second nozzle. Thus, it is possible to suppress the back diffusion of the second process gas into the gas supply pipe 310a.

Particularly, in the case of using the source gas as the second process gas according to the embodiments, the shut off valve 101a is closed while the shut off valve 101b is opened to supply the source gas into the reaction tube 203 through the second nozzle. By closing the shut off valve 101a, the gas supply pipe 310a and the inside of the reaction tube 203 are blocked. Thus, it is possible to completely suppress the back diffusion of the source gas into the gas supply pipe 310a. As a result, it is possible to reduce particles originated from by-products generated in the gas supply pipe 310.

As shown in FIG. 5 by a dot-and-dash line, a furnace opening box capable of performing local exhaust of the furnace opening part 226 may be provided so as to surround the furnace opening part 226. The furnace opening box can be used for preventing the gas leaks and the heat buildup in the furnace opening part 226. An inner atmosphere of the furnace opening box is a high temperature atmosphere of 50° C. to 200° C. In general, the heat resistant temperature of a valve is about 150° C. Thus, it is possible to use a heat resistant valve having a heat resistant temperature from 250° C. to 300° C. in the embodiments. However, even when the heat resistant valve is used, the operating lifetime of the heat resistant valve may be remarkably lowered and the replacement frequency may be shortened if the inner atmosphere of the furnace opening box is the high temperature atmosphere. As a countermeasure against the above-described problem, it is possible to add a cooling mechanism to the blocking part 101. Therefore, it is possible to provide a valve in the furnace opening box even when the inner temperature of the furnace opening box exceeds the heat resistant temperature of the valve.

Figure 9:
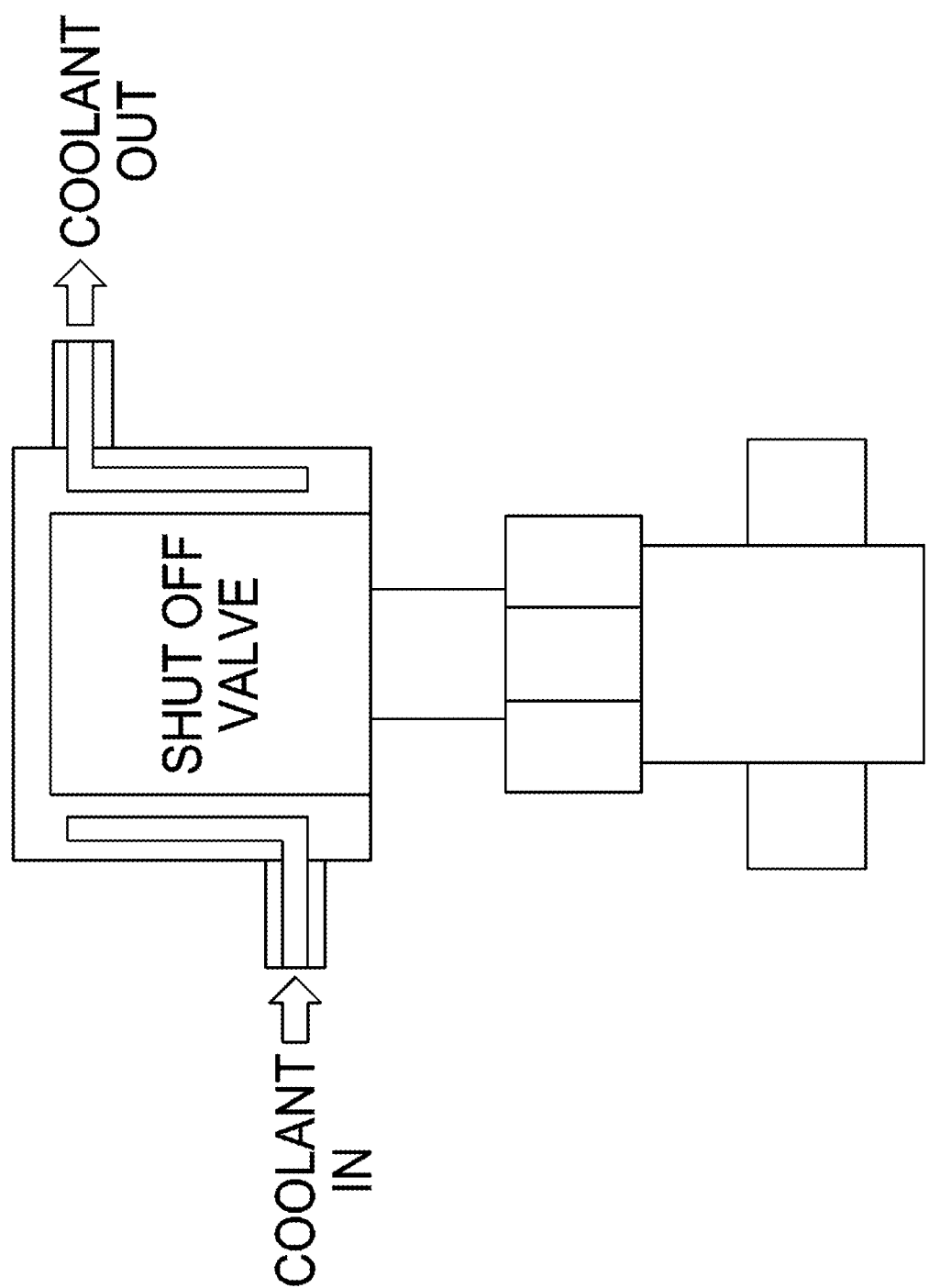
FIG. 9 schematically illustrates an exemplary configuration of a shut off valve e preferably used in the embodiments.

As shown in FIG. 9, a heat radiation method using coolant (cooling water) may be used as a cooling method. For example, a cooling block covers the shut off valve 101. As long as the inner temperature of the furnace opening box can be kept below the heat resistant temperature of the valve, it does not matter what kind of cooling method is used. For example, the cooling part may be configured to supply the coolant to the blocking part 101.

The exhaust system for exhausting the gas in the reaction tube 203 is provided. The controller 280 is configured to close the first blocking part and the second blocking part and to control the exhaust system to exhaust the unreacted source gas or the unreacted reactive gas from the reaction tube 203 when the supply of the reactive gas or the source gas to the substrates in the reaction tube 203 is completed. In addition, the controller 280 is configured to control the first process gas supply system, the first blocking part, the second process gas supply system, the second blocking part and the exhaust system such that the inside of the process chamber 201 is purged cyclically by adjusting the flow rate of the inert gas supplied into the reaction tube 203 while the first blocking part and the second blocking part are opened.

As shown in FIG. 5, the gas supply pipe 310 provided between the switching part 103 and the boundary part includes a flexible pipe whose shape is bendable. In the embodiments, the flexible pipe is provided in the gas supply pipe 310, and may be, for example, bellows-shaped. The blocking part 101 is installed integrally (or directly) on the side wall of the furnace opening part 226.

As shown in FIG. 5, the flexible pipe is provided in the furnace opening box. However, the flexible pipe is not limited thereto. For example, the flexible pipe may be provided in a piping between the gas box whereat the switching part 103 is provided and the furnace opening box whereat the blocking part 101 is provided. Since the piping between the gas box and the furnace opening box is installed on site (for example, at a semiconductor manufacturing factory), the installation of the piping is greatly influenced by conditions such as the layout of the apparatus to be connected, the facilities in the semiconductor manufacturing factory and the installation environment of the apparatus. Thus, it is necessary to adjust the layout or geometrical relationships between individual pipes which may be made of, for example, metal. However, it is impossible to adjust the layout of the piping when all of the pipes are made of metal. Therefore, the flexible pipe whose shape is bendable is indispensable.

Figure 4:
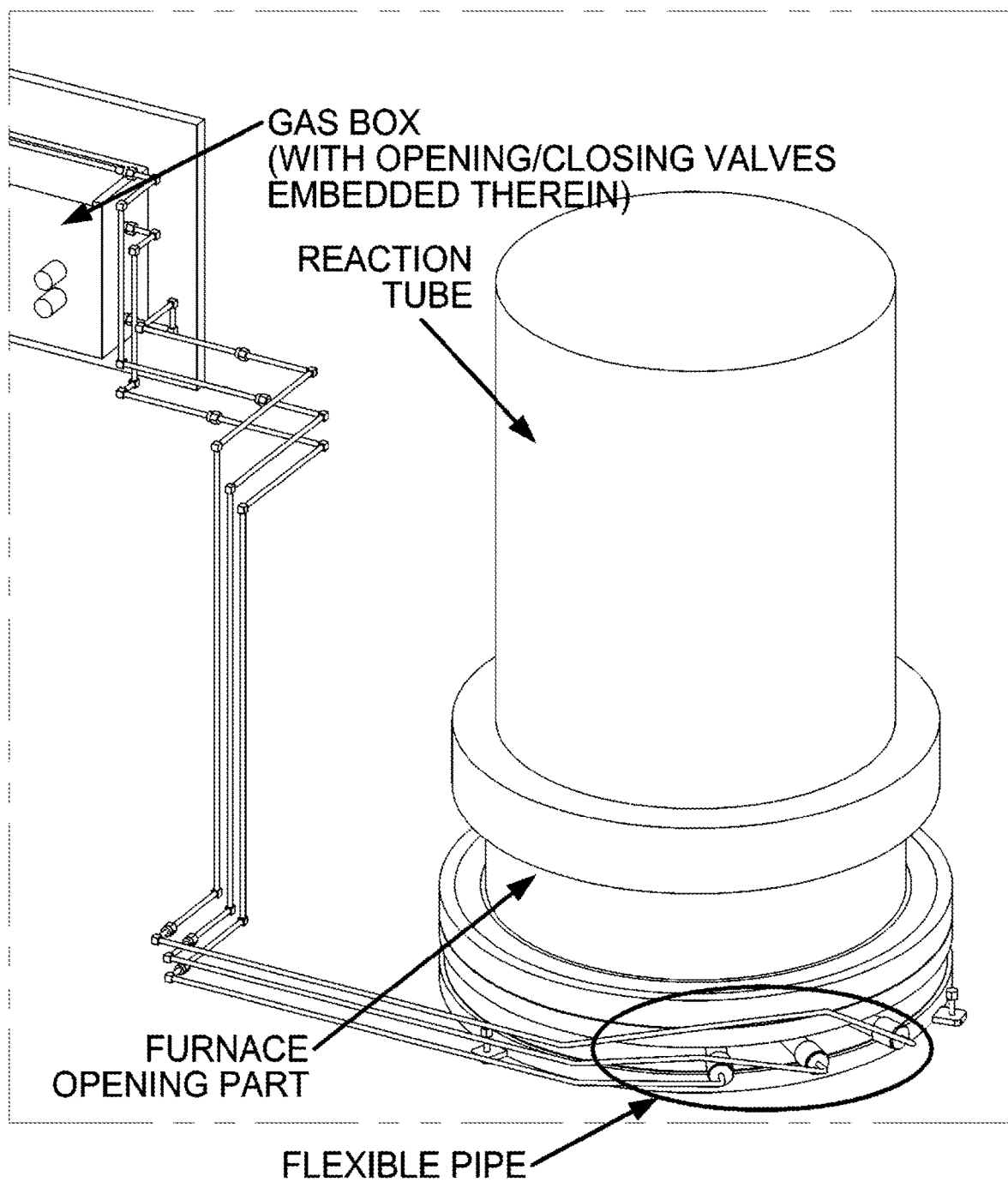
FIG. 4 schematically illustrates a piping structure in the vicinity of a conventional furnace opening part.

Conventionally, as shown in FIG. 4, a piping provided between the furnace opening part 226 and a switching part includes a flexible pipe. However, according to the configuration as shown in FIG. 5, no flexible pipe is provided between the furnace opening part 226 and the blocking part 101. In addition, according to the configuration as shown in FIG. 6, the gas supply pipe 310 is provided on the upstream side of the blocking part 101, but the flexible pipe provided in the gas supply pipe 310 is omitted.

FIG. 6 schematically illustrates a configuration that the exhaust part 102 is further provided so as to be adjacent to the blocking part 101 of the gas supply system shown in FIG. 5. Since the configuration excluding the exhaust part 102 is the same as the configuration shown in FIG. 5, only the exhaust part 102 will be described in detail. As shown in FIG. 6, the supply piping at the upstream side of the blocking part 101 is branched off at the exhaust part 102. A vent pipe is connected to the exhaust pipe 232 by the exhaust part 102. With such a configuration, the inside of the gas supply pipe 310 including the flexible pipe between the switching part 103 and the blocking part 101 can be purged cyclically without purging the reaction tube 203.

For example, in a film-forming sequence described later, the gas supply pipe 310a can be purged cyclically while supplying the source gas into the reaction tube 203 through the gas supply pipe 310b. Therefore, it is possible to improve the degree of cleanliness inside the gas supply pipe 310a. In addition, even if the inside of the reaction tube 203 is exposed to the atmospheric pressure in a substrate transfer step after the film-forming sequence described later is completed, the inside of the gas supply pipe 310 can be purged cyclically individually. Therefore, it is possible to further improve the degree of cleanliness inside the gas supply pipe 310.

When a space around the manifold 226 is small due to the apparatus configuration, it is difficult to install the blocking part 101 and the exhaust part 102 in the space. However, by providing the boundary part and the furnace opening part 226 integrally, it is possible to install the blocking part 101 and the exhaust part 102 in a space-saving manner and to improve the maintainability of the apparatus.

Hereinafter, with reference mainly to FIGS. 7 through 10, the shut off valve 101 provided close to and outside of the furnace opening part 226 will be described in detail.

Figure 7:
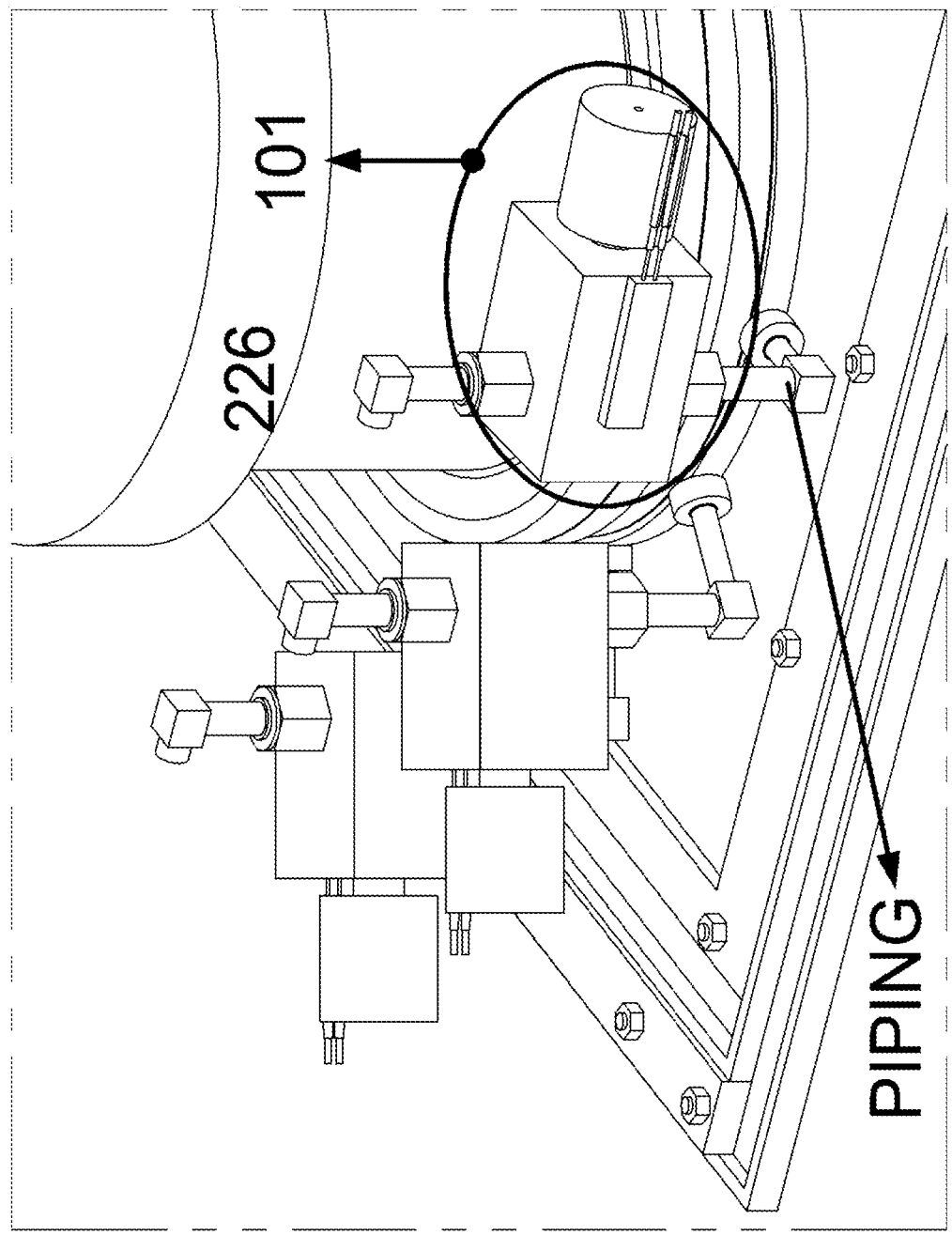
FIG. 7 schematically illustrates an exemplary configuration of a furnace opening part preferably used in the embodiments.
Figure 8:
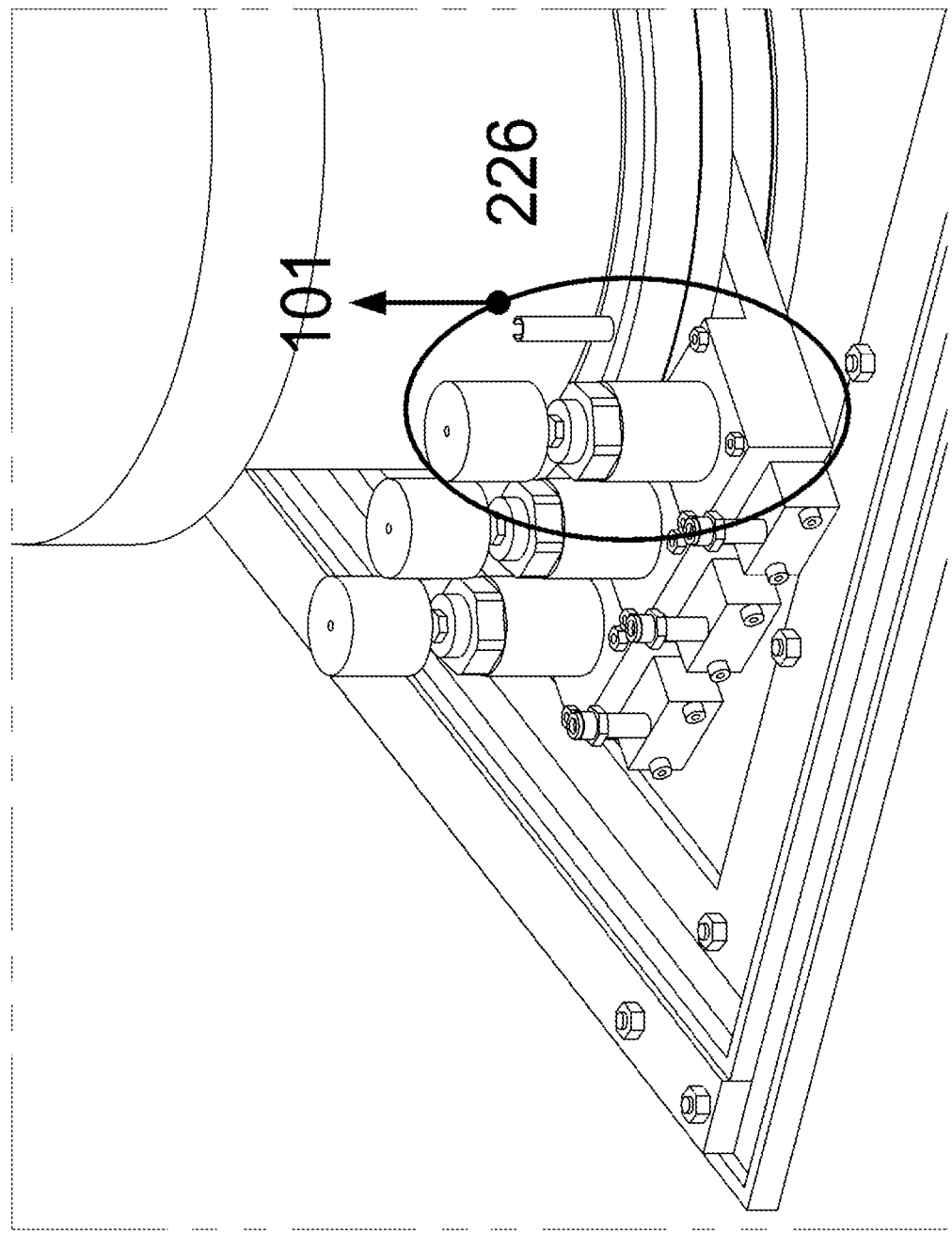
FIG. 8 schematically illustrates another exemplary configuration of the furnace opening part of the substrate processing apparatus preferably used in the embodiments.

The configuration between the furnace opening part 226 and the blocking part 101 in the embodiments may be a configuration as shown in FIG. 7 in which the furnace opening part 226 and the shut off valve 101 are directly connected (that is, the configuration where the piping is recognizable from outside), or may be a configuration as shown in FIG. 8 in which the furnace opening part 226 and the shut off valve 101 are integrated (that is, the configuration where the piping is not recognizable from outside). In addition, in FIGS. 7 and 8, the furnace opening part 226 with the blocking part 101 are illustrated.

Although not shown, the exhaust part 102 may be integrally formed as a united body with the furnace opening part 226 while being adjacent to the blocking part 101. In addition, as shown in FIG. 9, the blocking part 101 may be attached to the cooling mechanism.

The length (pipe length) of the piping installed between the furnace opening part 226 and the switching part in FIG. 4 will be compared with the length (pipe length) of the piping installed between the furnace opening part 226 and the blocking part 101 according to the embodiments. Assuming that the pipe length of the embodiments shown in FIG. 7 is 100 mm, the length ratio of the pipe length is about 1/5 to 1/30, and the pipe length including a connection part (not shown) of the embodiments shown in FIG. 8 is about 50 mm, the length ratio of its pipe length would be about 1/10 to 1/60. The ideal pipe length is zero (that is, when no piping is provided).

Figure 10:
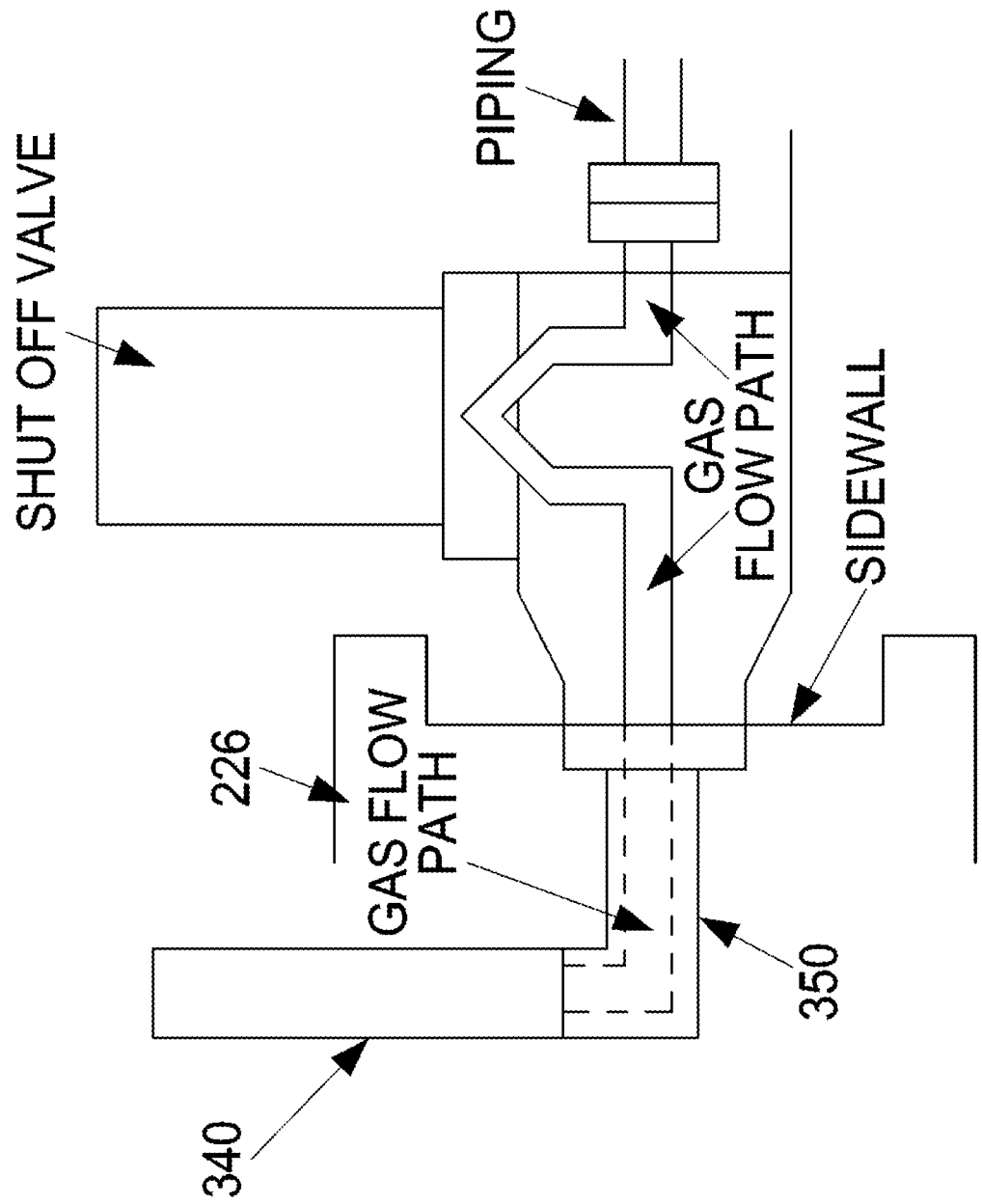
FIG. 10 schematically illustrates another exemplary configuration of the shut off valve preferably used in the embodiments.

FIG. 10 illustrates a configuration in which the blocking part 101 is integrated with the furnace opening part 226 in FIG. 8, that is, the blocking part 101 is attached on the side wall of the furnace opening part 226 without providing any piping therebetween. While the blocking part 101 is not illustrated in FIG. 10, a plurality of the blocking part 101 is provided at the furnace opening part 226.

An end of the blocking part 101 is connected to the nozzle (or the nozzle support part 350) provided in the furnace opening part 226, and the other end of the blocking part 101 is connected to the piping (the gas supply pipe 310 according to the embodiments) outside the furnace opening part 226. FIG. 10 illustrates the blocking part 101 when it is open. Referring to FIG. 10, a flow path of the gas extends from the gas supply pipe 310 to the nozzle part 340 via the blocking part 101.

In order to minimize the influence of the back diffusion of the process gas to the gas supply pipe 310, it is desirable not to provide the piping between the nozzle support part 350 and the blocking part 101. However, it is impossible in terms of the configuration of the blocking part 101. Thus, it is preferable that the blocking part 101 and the furnace opening part 226 are integrally structured as shown in FIG. 10.

Figure 3:
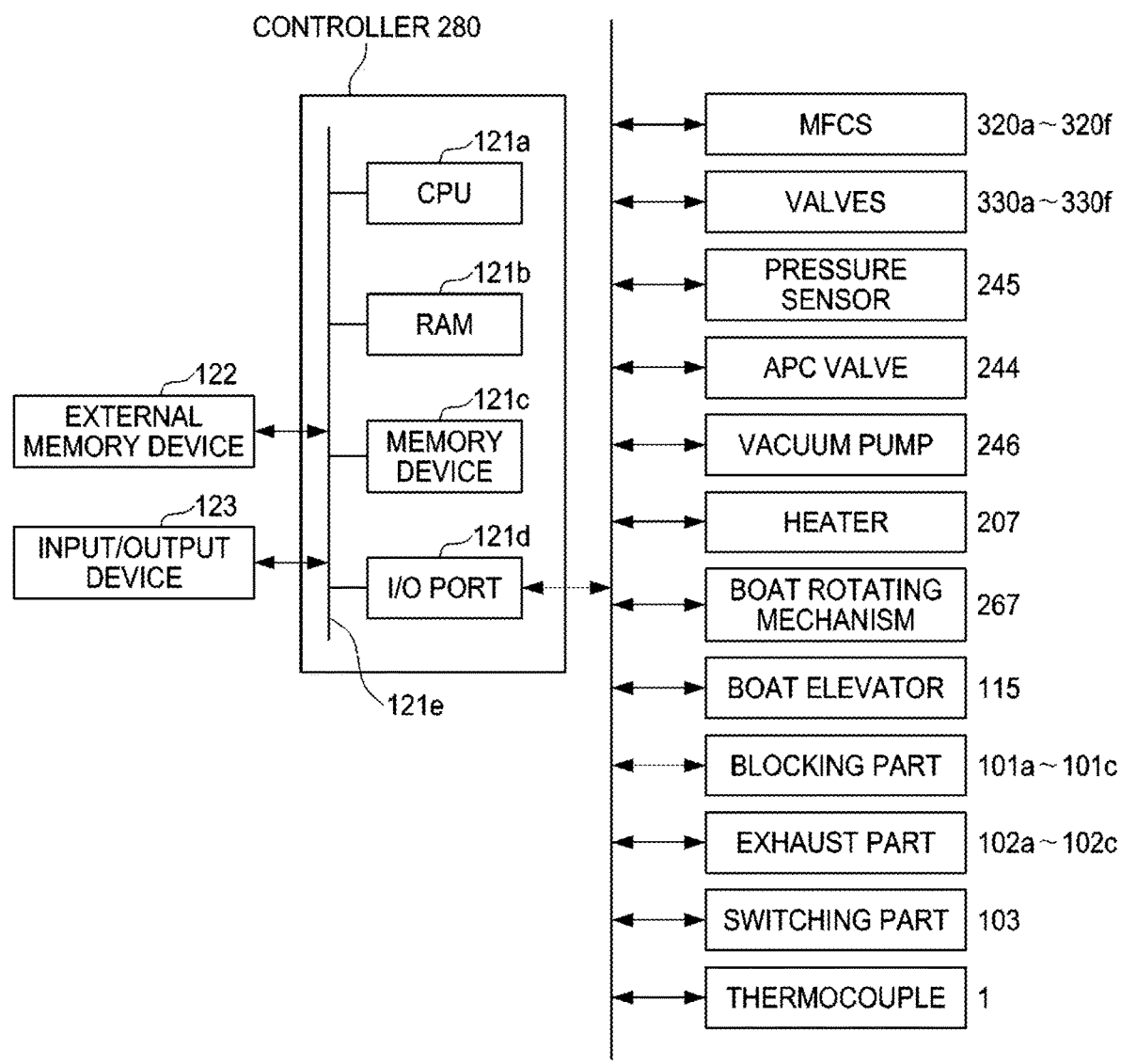
FIG. 3 is a block diagram schematically illustrating a configuration of a controller and components controlled by the controller of the substrate processing apparatus preferably used in the embodiments.

As shown in FIG. 3, the controller 280 serving as a control device (control mechanism) is constituted by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an input/output device 122 such as a touch panel is connected to the controller 280.

The memory device 121c is configured by components such as a flash memory and HDD (Hard Disk Drive). A control program for controlling the operation of the substrate processing apparatus or a process recipe containing information on the sequences and conditions of a substrate processing described later is readably stored in the memory device 121c. The process recipe is obtained by combining steps of the substrate processing described later such that the controller 280 can execute the steps to acquire a predetermine result, and functions as a program. Hereinafter, the process recipe and the control program are collectively referred to as a "program". In the present specification, "program" may indicate only the recipe, indicate only the control program, or indicate both of them. The RAM 121b is a work area where a program or data read by the CPU 121a is temporarily stored.

The I/O port 121d is connected to the above-described components such as the MFCs 320a through 320f, the valves 330a through 330f, the shut off valves 101a through 101c, the exhaust part (exhaust valve) 102a through 102c, the pressure sensor 245, the APC valve 244, the vacuum pump 246, the heater 207, the temperature sensor (thermocouple) 1, the boat rotating mechanism 267 and the boat elevator 115.

The CPU 121a is configured to read a control program from the memory device 121c and execute the read control program. Furthermore, the CPU 121a is configured to read a recipe from the memory device 121c according to an operation command inputted from the input/output device 122. According to the contents of the read recipe, the CPU 121a may be configured to control various operations such as flow rate adjusting operations for various gases by the MFCs 320a through 320f, opening/closing operations of the valves 330a through 330f, opening/closing operations of the shut off valves 101a through 101c, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor 1, an operation of adjusting rotation and rotation speed of the boat 217 by the boat rotating mechanism 267 and an elevating and lowering operation of the boat 217 by the boat elevator 115.

The controller 280 may be embodied by installing the above-described program stored in an external memory device 123 into a computer. For example, the external memory device 123 may include a magnetic tape, a magnetic disk such as a flexible disk and a hard disk, an optical disk such as a CD and a DVD, a magneto-optical disk such as MO, a semiconductor memory such as a USB memory and a memory card. The memory device 121c or the external memory device 123 may be embodied by a non-transitory computer readable recording medium. Hereafter, the memory device 121c and the external memory device 123 are collectively referred to as recording media. In the present specification, the term "recording media" may indicate only the memory device 121c, indicate only the external memory device 123, and indicate both of the memory device 121c and the external memory device 123. Instead of the external memory device 123, a communication means such as the Internet and a dedicated line may be used for providing the program to the computer.

Hereinafter, the operation of the substrate processing apparatus according to the embodiments will be described. The substrate processing apparatus is controlled by the controller 280.

After the boat 217 charged with the wafers 200 are loaded into the reaction tube 203, the seal cap 219 airtightly seals the reaction tube 203. By supplying the process gas into the reaction tube 203 while the wafers 200 are heated and maintained at a predetermined temperature in the airtightly sealed reaction tube 203, the wafers 200 are subject to a substrate processing such as a film-forming process.

By performing the film-forming process (substrate processing), for example, by performing a film-forming sequence shown in FIG. 11, a silicon nitride film (SiN film) is formed on the wafers 200. That is, the SiN film is formed on the wafers 200 by performing a cycle of the film-forming sequence a predetermined number of times (once or more). The cycle may include a step of supplying HCDS gas onto the wafers 200 in the process chamber 201, a step of removing the HCDS gas (residual gas) from the process chamber 201, a step of supplying $NH_3$ gas onto the wafers 200 in the process chamber 201 and a step of removing the $NH_3$ gas (residual gas) from the process chamber 201. The steps in the cycle are performed non-simultaneously.

In the present specification, "substrate" and "wafer" may be used as substantially the same meaning.

<Wafer Charging and Boat Loading Step>

After the boat 217 is charged with the wafers 200 (wafer charging), the boat 217 is elevated by the boat elevator 115 and loaded into the process chamber 201 (boat loading). With the boat 217 loaded, the seal cap 219 seals the lower end opening of the reaction tube 203 via the O-ring.

<Pressure and Temperature Adjusting Step>

The vacuum pump 246 vacuum-exhausts the process chamber 201 until the inner pressure of the process chamber 201 where the wafers 200 are accommodated reaches a desired pressure (vacuum degree). In the pressure and temperature adjusting step, the inner pressure of the process chamber 201 is measured by the pressure sensor 245, and the APC valve 244 is feedback-controlled based on the measured pressure. The vacuum pump 246 continuously vacuum-exhausts the process chamber 201 until at least the processing of the wafers 200 is completed.

The heater 207 heats the process chamber 201 until the temperature of the wafers 200 in the process chamber 201 reaches a desired temperature. The amount of the current flowing to the heater 207 is feedback-controlled based on the temperature detected by the temperature sensor 1 such that the inner temperature of the process chamber 201 has a desired temperature distribution. The heater 207 continuously heats the process chamber 201 until at least the processing of the wafers 200 is completed.

The boat rotating mechanism 267 starts to rotate the boat 217 and the wafers 200. As the boat rotating mechanism 267 rotates the boat 217, the wafers 200 supported by the boat 217 are rotated. Until at least the process for the wafers 200 is completed, the boat rotating mechanism 267 continuously rotates the boat 217 and the wafers 200.

<Film-Forming Process>

Next, after the temperature of the process chamber 201 is stabilized at a predetermined processing temperature, the film-forming process is performed by performing a first step and a second step sequentially.

<First Step>

In the first step, the source gas (HCDS gas) is supplied onto the wafers 200 in the process chamber 201. The first step includes at least a pre-purge step, a source gas supply step, a source gas exhaust step and a post-purge step. The respective steps will be described below.

<Pre-purge Step>

First, the valves 330b and 330e are opened to supply HCDS gas into the gas supply pipe 310b. However, in the pre-purge step, the shut off valve 101b is closed. Thus, the HCDS gas is not supplied into the process chamber 201. Simultaneously, the valves 330d and 330f are opened to supply $N_2$ gas into the gas supply pipes 310a and 310c. Further, the shut off valves 101a and 101c may be opened such that $N_2$ gas whose flow rate is adjusted by MFCs is supplied into the process chamber 201 at a predetermined flow rate, and the $N_2$ gas is exhausted through the exhaust pipe 232. In the embodiments, preferably, the exhaust valve 102b is provided adjacent to the shut off valve 101b. By opening the exhaust valve 102b, the HCDS gas can be exhausted from the gas supply pipe 310b to the exhaust pipe 232 through the exhaust valve 102b.

<Source Gas Supply Step>

Next, with the valves 330b and 330e open, the shut off valve 101b is opened to supply the HCDS gas into the process chamber 201. In the source gas supply step, the flow rate of the HCDS gas is adjusted by the MFC. After the flow rate of the HCDS gas is adjusted by the MFC, the HCDS gas is supplied onto the wafers 200 through the nozzle part 340b, and exhausted through the exhaust pipe 232. In the source gas supply step, the shut off valve 101a and the shut off valve 101c are closed. Thereby, it is possible to suppress the back diffusion of the HCDS gas to the gas supply pipes 310a and 310c.

<Source Gas Exhaust Step>

Next, with the shut off valve 101a and the shut off valve 101c closed, the shut off valve 101b is closed. In the source gas exhaust step, with the APC valve 244 open, the vacuum pump 246 vacuum-exhausts the inside of the process chamber 201 to remove a residual HCDS gas which did not react or which contributed to the formation of a silicon (Si)-containing layer serving as a first layer from the process chamber 201.

Then, the source gas supply step and the source gas exhaust step are sequentially performed (for example, three times in the embodiments). Thereby, the first layer is formed on the top surface of the wafers 200. Preferably, the first layer is formed on the top surface of the wafers 200 by performing a cycle including the source gas supply step and the source gas exhaust step a plurality of times. In the embodiments, the nozzle for supplying the HCDS gas into the process chamber 201 may include a short pipe nozzle whose front end is open. In order to make the gas concentration distribution uniform, the gas such as the source gas is supplied cyclically (which leads to a cyclic gas flow), as described above. However, the method of supplying the gas is appropriately selected in accordance with the shape of the nozzle.

<Post-Purge Step>

After the first layer is formed, the valve 330b is closed to stop the supply of the HCDS gas. In the post-purge step, by opening the valves 330d through 330f and the shut off valve 101a through 101c, the N₂ gas is supplied into the process chamber 201. The N₂ gas serves as a purge gas, thus, it is possible to improve an effect of removing the residual gas in the process chamber 201 from the process chamber 201.

<Gas Purging Step>

After the post-purge step is completed, by maintaining the valves 330d through 330f and the shut off valve 101a through 101c open, the N₂ gas is continuously supplied into the process chamber 201. The flow rate of the N₂ gas is changed with a predetermined period. For example, the flow rate of the N₂ gas is switched between a first flow rate (flow rate A) and a second flow rate (flow rate B less than the flow rate A) a predetermined number of times. According to the embodiments, for example, the switching of the flow rate of the N₂ gas is performed twice.

In the embodiments, the first step includes the gas purging step for reliably exhausting the gas remaining in the process chamber 201 from the inside of the process chamber 201 before the reactive gas is supplied. However, the second step may also include the gas purging step. The gas purging step of the second step will be described later.

<Second Step>

After the first step is completed, NH₃ gas serving as the reactive gas is supplied onto the wafers 200 in the process chamber 38, i.e. onto the first layer formed on the wafers 200 in the process chamber 201. The NH₃ gas is thermally activated and then supplied onto the wafers 200.

In the second step, the valves 330a, 330d and 101a are controlled in the same manners as in the first step. The flow rate of the NH₃ gas is adjusted by the MFCs, and the NH₃ gas with the flow rate thereof adjusted is supplied into the process chamber 201 through the nozzle part 340a and is then exhausted through the exhaust pipe 232. Thereby, the NH₃ gas is supplied onto the wafers 200. The NH₃ gas supplied onto the wafers 200 reacts with the first layer, i.e. at least a portion of the silicon-containing layer formed on the wafers 200 in the first step. As a result, the first layer is thermally nitrided under non-plasma atmosphere and modified into a second layer containing silicon (Si) and nitrogen (N), that is, a silicon nitride layer (SiN layer). Alternately, the NH₃ gas may be plasma-excited and then supplied onto the wafers 200 to nitride the first layer under plasma atmosphere into the second layer (SiN layer).

After the second layer is formed, the valves 330a and 330d are closed to stop the supply of the NH₃ gas into the process chamber 201. An unreacted gas, the NH₃ gas that has contributed to formation of the second layer and the reaction by-products remaining in the process chamber 201 are exhausted from the process chamber 201 in the same manner as in the first step.

<Gas Purging Step>

The second step may further include the gas purging step to more reliably exhaust the gas remaining in the process chamber 201 from the process chamber 201 after the reactive gas is supplied.

Similar to the gas purging step of the first step, by opening the valves 330d through 330f and the shut off valve 101a through 101c, the N₂ gas is continuously supplied into the process chamber 201. The flow rate of the N₂ gas is changed with a predetermined period. For example, the flow rate of the N₂ gas is switched between the first flow rate (flow rate A) and the second flow rate (flow rate B less than the flow rate A) a predetermined number of times. According to the embodiments, for example, the switching of the flow rate of the N₂ gas is performed four times.

<Post-purge Step>

After the gas purging step of the second step is performed a predetermined number of times, by maintaining the valves 330d through 330f and the shut off valve 101a through 101c open, the N₂ gas whose flow rate is adjusted to a predetermined flow rate is supplied into the process chamber 201 for a predetermined time to complete the purge step. Thereby, the film-forming sequence of the embodiments is completed.

<Performing Predetermined Number of Times>

By performing the cycle wherein the first step and the second step according to the film-forming sequence shown in FIG. 11 are performed non-simultaneously in order a predetermined number of times (n times), the SiN film having a predetermined composition and a predetermined thickness is formed on the wafers 200. It is preferable that the cycle is performed a plurality of times. That is, the cycle is performed (repeated) until the second film (SiN film) having the predetermined thickness is obtained by controlling the second layer (SiN layer) formed in each cycle to be thinner than the second film (SiN film) having the predetermined thickness and stacking the second layer (SiN) layer by performing the cycle.

<Purging and Returning to Atmospheric Pressure Step>

After the film-forming process is completed, the valves 310e and 310f are opened to supply the N₂ gas into the process chamber 201 through each of the gas supply pipes 310b and 310c, and then the N₂ gas supplied into the process chamber 201 is exhausted through the exhaust pipe 232. The gas or the reaction by-products remaining in the process chamber 201 are removed from the process chamber 201 by supplying the N₂ gas (purging). Thereafter, the inner atmosphere of the process chamber 201 is replaced with the inert gas (substitution by inert gas), and the inner pressure of the process chamber 201 is returned to atmospheric pressure (returning to atmospheric pressure).

<Boat Unloading and Wafer Discharging Step>

Thereafter, the seal cap 219 is lowered by the boat elevator 115 and the lower end of the reaction tube 203 is opened. The boat 217 with the processed wafers 200 charged therein is unloaded from the reaction tube 203 through the lower end of the reaction tube 203 (boat unloading). The processed wafers 200 are then unloaded (discharged) from the boat 217 (wafer discharging).

According to the embodiments, the HCDS gas is supplied into the reaction tube 203 while opening/closing the shut off valve 101 provided at the boundary between the nozzle and the gas supply system. Thus, by closing the shut off valve 101 connected to a process gas supply system other than the process gas supply system for supplying the HCDS gas, the HCDS gas is prevented from being diffused thereto. Therefore, it is possible to reduce particles originated from the by-products in the piping such as the gas supply pipe 310.

According to the embodiments, it is possible to suppress the back diffusion of HCDS gas by closing the shut off valve 101 of the processing gas supply system other than the HCDS gas. Therefore, it is possible to remarkably reduce the range that should be heated in the piping constituting the process gas supply system for supplying the HCDS gas.

According to the embodiments, the processing gas supply system other than the processing gas supply system for supplying the HCDS gas also heats the piping where the HCDS gas is diffused. However, depending on the kind of gas, it may be unnecessary to heat the piping. In addition, even if the gas makes it necessary to heat the piping, the heating temperature can be moderated. Therefore, it is possible to reduce the range where the piping should be heated to a high temperature for preventing liquefaction of the HCDS, thereby leading to a reduction in the heater cost.

FIG. 12 schematically illustrates the dependence of the flow rate of the $N_2$ gas with the change of the flow rate of the counter $N_2$ gas when the counter $N_2$ gas is supplied through the two process gas supply mechanisms of the process gas supply system including the three mechanisms other than the process gas supply mechanism of the process gas supply system for supplying a film-forming gas (one of the source and the reactive gas). For example, when the film-forming gas is supplied through the first process gas supply mechanism, the counter $N_2$ gas is supplied through the second process gas supply mechanisms and the third process gas supply mechanism.

For example, the processing conditions for obtaining the dependence are as follows:

The temperature of the wafers 200: 100° C. to 800° C., preferably, 400° C. to 750° C. For example, 630° C. according to the embodiments;

The inner pressure of the process chamber: 5 Pa to 4,000 Pa, preferably, 10 Pa to 1,332 Pa;

The flow rate of the HCDS gas: 1 sccm to 2,000 sccm, preferably 50 sccm to 500 sccm;

The flow rate of the $NH_3$ gas: 100 sccm to 30,000 sccm;
The flow rate of the $N_2$ gas: 1 sccm to 50,000 sccm; and
The thickness of the SiN film: 0.2 nm to 100 nm.

FIG. 12 illustrates the average thicknesses and the uniformities of films formed on the wafers 200 with respect to the presence and the flow rate of the counter $N_2$ gas. Specifically, the average thickness and the uniformity of a film formed on a surface of a wafer placed at an uppermost portion (indicated by "TOP" in FIG. 12) of a substrate processing region, the average thickness and the uniformity of a film formed on a surface of a wafer placed at a center portion (indicated by "CNT" in FIG. 12) of the substrate processing region and the average thickness and the uniformity of a film formed on a surface of a wafer placed at a lowermost portion (indicated by "BTM" in FIG. 12) of the substrate processing region are illustrated, respectively. In addition, the uniformities of the films between the wafers 200 in the above cases are also illustrated in FIG. 12. Hereinafter, the uniformity of the film formed on the surface of the wafer is also referred to as "the uniformity in the wafer", and the uniformity of the films between the wafers 200 is also referred to as "the uniformity between the wafers".

In FIG. 12, "W/O COUNTER $N_2$ GAS" corresponds to the embodiments. That is, according to the embodiments, the shut off valve 101 provided in the gas supply system (that has supplied the counter $N_2$ gas into the process chamber 201 so far) is closed while the HCDS gas or the $NH_3$ gas is supplied. Therefore, it is possible to prevent the back diffusion of the HCDS gas or the $NH_3$ gas to the gas supply pipe 310, so that the supply of the counter $N_2$ gas is not necessary.

When the counter $N_2$ gas is not supplied, the HCDS gas or the $NH_3$ gas is not diluted by the counter $N_2$ gas. Thus, the concentration of the HCDS gas or the $NH_3$ gas in the process chamber 201 is higher than that of the HCDS gas or the $NH_3$ gas in case where the counter $N_2$ gas is supplied according to the flow rates illustrated in FIG. 12. Therefore, the average thickness of the film formed on the wafers placed at each of the upper region ("TOP"), the center region ("CNT") and the lower region ("BTM") of the substrate processing region is higher than the case where the counter $N_2$ gas is supplied.

When the counter $N_2$ gas is not supplied, the HCDS gas or the $NH_3$ gas in the process chamber 201 can contact the surface of each wafer 200 uniformly (or in its entirety) without being affected by the counter $N_2$ gas. Therefore, the uniformity in the wafer at each of the upper region ("TOP"), the center region ("CNT") and the lower region ("BTM") of the substrate processing region is lower than the case where the counter $N_2$ gas is supplied.

In FIG. 12, as described above, "TOP" indicates that the wafer is disposed at the uppermost portion of the substrate processing region, "BTM" indicates that the wafer is disposed at the lowermost portion of the substrate processing region and "CNT" indicates that the wafer is disposed at the center portion of the substrate processing region. For example, if the wafers 200 are place at a substrate processing region of a batch process furnace having 33 slots in total (i.e., in slot #1 through slot #33), and dummy wafers are disposed at the slots #1 to #4 and the slots #30 to #33, the substrate processing region would be defined by the slots #5 to #29. In this case, "TOP" would indicate that the wafer is disposed at the slot #29, "CNT" would indicate that the wafer is disposed at the slot #17, and "BTM" would indicate that the wafer is disposed at the slot #5.

The uniformity in the wafer is obtained by measuring the thickness of the film at predetermined positions in the surface of the wafer and averaging the measured thickness. The uniformity between the wafers is calculated by: (i) obtaining the uniformities in the wafer for all of the wafers 200 placed in slots from "BTM" to "TOP" in the substrate processing region and (ii) averaging the obtained uniformities. According to the batch process furnace described above, the uniformity between the wafers is calculated by averaging the uniformities in the wafer obtained from 25 slots (that is, the slots #5 to #29).

According to the embodiments, by eliminating the need for the counter $N_2$ gas, it is possible to improve the uniformity in the wafer and the uniformity between the wafers. Particularly, the uniformity between the wafers is significantly improved.

Next, referring to FIG. 13, a current film-forming sequence without the shut off valve and the film-forming sequence with the shut off valve according to the embodiments will be compared. Referring to FIG. 13, the time required for replacing the gas in the reaction tube in the purge step (also referred to as a "gas replacement step") after the process gas is supplied is remarkably improved.

As shown in FIG. 4, the piping extends to the opening/closing valve closest to the furnace opening part 226. In a conventional purge step, the entire range of the piping extending to this opening/closing valve should be exhausted by the vacuum pump 246. Therefore, the exhaust efficiency is low, and time is spent to perform the gas replacement step. However, according to the embodiments, it is sufficient to vacuum-exhaust only a partial range of the piping extending to the nozzle part 340 because the vacuum pump 246 operates while the blocking part 101 is closed. Thus, the exhaust efficiency according to the embodiments can be remarkably improved as compared with the conventional sequence. In particular, as shown in FIG. 13, it is possible to shorten the time required for the cycle purge step after the process gas is supplied.

For example, referring to FIG. 13, the time required to perform one cycle of the current film-forming sequence is 51 seconds, and the time required to perform one cycle of the film-forming sequence according to the embodiments with the shut off valve 101 is 41 seconds. Thus, according to the embodiments, the time required to perform one cycle can be shortened by about 20% (10 seconds) compared with that of the current film-forming sequence.

Thus, according to the embodiments, by closing the shut off valve in the purge step after the process gas is supplied, it is possible to remarkably improve the gas replacement efficiency in the reaction tube. Therefore, it is possible to shorten the time required for the purging step of the film-forming sequence. In addition, it is possible to shorten the time of performing the film-forming sequence.

According to the embodiments, one or more advantageous effects described below can be achieved.

(a) According to the embodiments, it is possible to suppress the back diffusion of the gas to the upstream side of the gas supply pipe by providing shut off valve outside of the manifold and integrating the shut off valve with the manifold.

(b) According to the embodiments, the shut off valve is provided in the vicinity of the side wall of the furnace opening part. Thus, it is possible to suppress the back diffusion of the process gas into the gas supply pipe by closing the shut off valve while the process gas is supplied to the reaction tube through other gas supply pipe.

(c) According to the embodiments, by suppressing the back diffusion of the process gas to the upstream side of the gas supply pipe, the by-products such as ammonium chloride can be prevented from adhering to the inside of the gas supply pipe. Therefore, it is possible to reduce the particles originated from the by-products.

(d) According to the embodiments, it is possible to suppress the back diffusion of the process gas into the gas supply pipe. Thus, it becomes unnecessary to provide the inert gas (the counter $N_2$ gas in the embodiments) for suppressing the back diffusion of the film-forming gas to other gas supply pipes when the film-forming gas is supplied to the gas supply pipe. Therefore, it is possible to suppress the waste of the inert gas.

(e) According to the embodiments, it is possible to reduce the range that should be heated in the piping and to moderate the heating temperature for the piping by blocking the atmosphere of the process chamber from the atmosphere of each gas supply pipe.

(f) According to the embodiments, since the shut off valve is provided, it is possible to suppress the back diffusion of a vaporized gas supplied through one gas supply pipe into the other gas supply pipes. Therefore, although it depends on the gas supplied into the other gas supply pipes, it is possible to reduce the range that should be heated in the piping if the other gas supply pipes themselves do not need to be heated.

(g) When the gas supply pipe itself needs to be heated, the temperature of the heater must be set to that of the gas supply pipe even in case where the temperature uniformity requirement at a high temperature is not so high. However, according to the embodiments, the temperature uniformity at a high temperature of the heater need not be as high as that of the gas supply pipe because the shut off valve is provided. Therefore, it is possible to use an inexpensive heater such as a heater capable of heating at a relatively low temperature and a heater having a simple heat insulating structure.

(h) According to the embodiments, it is possible to improve the uniformity of film thickness as a result by closing the shut off valve instead of supplying the counter $N_2$ gas.

(i) According to the embodiments, by closing the shut off valve and suppressing the back diffusion of the gas to the upstream side of the gas supply pipe, it is possible to improve the gas replacement efficiency in the process chamber, and to shorten the time of performing the film-forming sequence.

While the above-described embodiments are described by way of an example in which the vertical type semiconductor manufacturing apparatus is used to form the film, the above-described technique is not limited thereto. For example, the above-described technique may be applied to the film formation using a horizontal type semiconductor manufacturing apparatus.

While the above-described embodiments are described by way of an example in which the HCDS serving as the source gas is used to form the film, the above-described technique is not limited thereto. Instead of the HCDS gas, for example, an inorganic halosilane source gas such as monochlorosilane ($SiH_3Cl$, abbreviated as MCS) gas, dichlorosilane ($SiH_2Cl_2$, abbreviated as DCS) gas, trichlorosilane ($SiHCl_3$, abbreviated as TCS) gas, tetrachlorosilane gas, that is, silicon tetrachloride ($SiCl_4$, abbreviated as STC) gas and octachlorotrisilane ($Si_3Cl_8$, abbreviated as OCTS) gas may be used as the source gas. Instead of the HCDS gas, for example, an amino-based (amine-based) silane source gas free of halogen such as trisdimethylaminosilane ($Si[N(CH_3)_2]_3H$, abbreviated as 3DMAS) gas, tetrakisdimethylaminosilane ($Si[N(CH_3)_2]_4$, abbreviated as 4DMAS) gas, bisdiethylaminosilane ($Si[N(C_2H_5)_2]_2H_2$, abbreviated as BDEAS) gas and bis(tertiary-butyl amino)silane gas ($SiH_2[NH(C_4H_9)]_2$, abbreviated as BTBAS) gas may also be used as the source gas. Instead of the HCDS gas, for example, an inorganic silane source gas free of halogen such as monosilane ($SiH_4$, abbreviated as MS) gas, disilane ($Si_2H_6$, abbreviated as DS) gas and trisilane ($Si_3H_8$, abbreviated as TS) gas may also be used as the source gas.

While the above-described embodiments are described by way of an example in which the $NH_3$ serving as the reactive gas is used to form the film, the above-described technique is not limited thereto. Instead of the $NH_3$ gas, for example, a hydrogen nitride-based gas such as diazene ($N_2H_2$) gas, hydrazine ($N_2H_4$) gas, $N_3H_8$ gas and compounds thereof may be used as the reactive gas. Instead of the $NH_3$ gas, for example, an ethylamine-based gas such as triethylamine (($C_2H_5$)$_3$N, abbreviated as TEA) gas, diethylamine (($C_2H_5$)$_2$NH, abbreviated as DEA) gas and monoethylamine ($C_2H_5NH_2$, abbreviated as MEA) gas may also be used as the reactive gas. Instead of the $NH_3$ gas, for example, a methylamine-based gas such as trimethylamine (($CH_3$)$_3$N, abbreviated as TMA) gas, dimethylamine (($CH_3$)$_2$NH, abbreviated as DMA) gas and monomethylamine ($CH_3NH_2$, abbreviated as MMA) may also be used as the reactive gas. Instead of the $NH_3$ gas, for example, an organic hydrazine-based gas such as trimethylhydrazine (($CH_3$)$_2N_2(CH_3)$H, abbreviated as TMH) gas may also be used as the reactive gas.

While the above-described embodiments are described by way of an example in which the SiN film is formed by using the HCDS gas as the source gas and the nitrogen (N)-containing gas such as the $NH_3$ gas as the reactive gas, the above-described technique is not limited thereto. For example, the above-described techniques may be applied to the formations of a film such as a silicon oxide film (SiO film), a silicon oxynitride film (SiON film), a silicon oxycarbonitride film (SiOCN film), a silicon oxycarbide film (SiOC film), a silicon carbonitride film (SiCN film), a silicon boronitride film (SiBN film) and a silicon boron carbonitride film (SiBCN film) according to the film-forming sequence described above by using an oxygen-containing gas such as an oxygen ($O_2$) gas, a carbon-containing gas such as a propylene ($C_3H_6$) gas and a boron-containing gas such as boron trichloride ($BCl_3$) instead of or in addition to the gases described above.

In addition, the order of supplying the gases may be changed appropriately. When the above-described technique is applied to the film-forming process of the above-described films, the processing conditions of film-forming process for the above-described films may be substantially the same as those of the film-forming process according to the embodiments and the same advantageous effects as the embodiments may be obtained. That is, the above-described technique may be preferably applied to form a film containing a predetermined element such as a semiconductor element and a metal element.

While the above-described embodiments are described by way of an example in which the film is deposited on the substrate, the above-described technique is not limited thereto. For example, the above-described technique may be preferably applied to the processes such as an oxidation process, a diffusion process, an annealing process and an etching process of the substrate or the film or layer formed on the substrate. The above-described embodiments and modified examples may be appropriately combined. The processing conditions of the combinations may be substantially the same as the above-described embodiments or the modified examples.

While the technique is described by way of the above-described embodiments and the examples, the above-described technique is not limited thereto. The above-described technique may be modified in various ways without departing from the gist thereof.

The above-described technique can be preferably applied to a substrate processing apparatus for forming a film on a substrate.

According to the technique described herein, it is possible to provide an opening/closing valve in the vicinity of a furnace opening part.

What is claimed is:

1. A method of manufacturing a semiconductor device using a gas supply system and an exhaust system configured to exhaust a gas from inside of a reaction tube,
the gas supply system comprising:
a nozzle provided at a furnace opening part and extending from the furnace opening part to an inside of the reaction tube;
a blocking part provided at an upstream side of the nozzle and installed close to a side wall of the furnace opening part; and
a switching part provided at an upstream side of the blocking part, and
the method comprising:
(a) loading a substrate retainer accommodating a plurality of substrates into the reaction tube; and
(b) processing the plurality of the substrates, wherein (b) comprises:
(b-1) supplying the gas to the substrates inside of the reaction tube through the nozzle by controlling the gas supply system to co-operate with the blocking part and the switching part such that the gas flows into the reaction tube via the blocking part, the switching part and the nozzle; and
(b-2) exhausting the gas from the reaction tube by controlling the exhaust system by the blocking part being closed when a supply of the gas to the substrates inside of the reaction tube is completed,
wherein the blocking part connected to the nozzle is directly provided at the furnace opening part without providing a pipe between the blocking part and an outer wall of the furnace opening part.

2. The method of claim 1, wherein the blocking part is installed at a boundary between the nozzle and the pipe wherein the pipe is not located between the blocking part and the side wall of the furnace opening part.

3. The method of claim 1, wherein the gas supply system further comprises an exhaust part configured to exhaust an inside of the pipe provided between the switching part and the blocking part.

4. The method of claim 1, wherein the gas supply system and the exhaust system are controlled by a controller to cyclically purge the inside of the reaction tube while the blocking part being open.

5. The method of claim 1, wherein the switching part and the blocking part are controlled by a controller to co-operate with one another to supply an inert gas to the inside of the reaction tube.

6. A method of manufacturing a semiconductor device using a gas supply system and an exhaust system configured to exhaust a gas from inside of a reaction tube,
the gas supply system comprising:
a nozzle provided at a furnace opening part and extending from the furnace opening part to an inside of the reaction tube;
a blocking part provided at an upstream side of the nozzle and installed close to a side wall of the furnace opening part; and
a switching part provided at an upstream side of the blocking part, and
the method comprising:
(a) loading a substrate retainer accommodating a plurality of substrates into the reaction tube; and (b) processing the plurality of the substrates, wherein (b) comprises:
- (b-1) supplying the gas to the substrates inside of the reaction tube through the nozzle by controlling the gas supply system to co-operate with the blocking part and the switching part such that the gas flows into the reaction tube via the blocking part, the switching part and the nozzle; and
- (b-2) exhausting the gas from the reaction tube by controlling the exhaust system by the blocking part being closed when a supply of the gas to the substrates inside of the reaction tube is completed, wherein the blocking part comprises a cooling part configured to supply a coolant to the blocking part to cool the blocking part.

7. A method of manufacturing a semiconductor device using a gas supply system and an exhaust system configured to exhaust a gas from inside of a reaction tube, the gas supply system comprising:
- a nozzle provided at a furnace opening part and extending from the furnace opening part to an inside of the reaction tube;
- a blocking part provided at an upstream side of the nozzle and installed close to a side wall of the furnace opening part; and
- a switching part provided at an upstream side of the blocking part, and the method comprising:
(a) loading a substrate retainer accommodating a plurality of substrates into the reaction tube; and
(b) processing the plurality of the substrates, wherein (b) comprises:
- (b-1) supplying the gas to the substrates inside of the reaction tube through the nozzle by controlling the gas supply system to co-operate with the blocking part and the switching part such that the gas flows into the reaction tube via the blocking part, the switching part and the nozzle; and
- (b-2) exhausting the gas from the reaction tube by controlling the exhaust system by the blocking part being closed when a supply of the gas to the substrates inside of the reaction tube is completed, wherein the blocking part comprises a furnace opening box part configured to locally exhaust the furnace opening part, and the blocking part is provided in the furnace opening box part.

8. A method of manufacturing a semiconductor device using a gas supply system and an exhaust system configured to exhaust a gas from inside of a reaction tube, the gas supply system comprising:
- a plurality of nozzles provided at a furnace opening part and extending from the furnace opening part to an inside of the reaction tube;
- a blocking part provided at an upstream side of each of the plurality of the nozzles and installed close to a side wall of the furnace opening part; and
- a switching part provided at an upstream side of the blocking part, and the method comprising:
(a) loading a substrate retainer accommodating a plurality of substrates into the reaction tube; and
(b) processing the plurality of the substrates, wherein (b) comprises:
- (b-1) supplying a plurality of gases into the substrates inside of the reaction tube through one of the plurality of the nozzles by controlling the gas supply system to co-operate with a plurality of blocking parts and the switching part such that the plurality of the gases flow into the reaction tube via the plurality of blocking parts connected to at least one of the nozzles and the switching part, respectively; and
- (b-2) exhausting the plurality of the gases from the reaction tube by controlling the exhaust system by the blocking part connected to the at least one of the plurality of the nozzles being closed when a supply of the plurality of the gases to the plurality of the substrates through the at least one of the plurality of the nozzles in the reaction tube is complete, wherein the plurality of blocking parts respectively connected to the plurality of nozzles are directly provided at the furnace opening part without providing a pipe between each of the plurality of blocking parts and an outer wall of the furnace opening part.

9. The method of claim 8, wherein (b-1) comprises: (b-1-1) supplying a first gas and a second gas; and (b-1-2) processing the plurality of the substrates, and
wherein, under control of a controller, (i) a first one of the blocking parts is opened to supply the first gas to the plurality of the substrates accommodated in the reaction tube and a second one of the blocking parts is closed so as not to supply the second gas, and/or (ii) the second one of the blocking parts is opened to supply the second gas to the plurality of the substrates accommodated in the reaction tube and the first one of the blocking parts is closed so as not to supply the first gas.

10. The method of claim 8, wherein the gas supply system and the exhaust system are controlled by a controller to cyclically purge the inside of the reaction tube while each of the plurality of the blocking parts being open.

11. The method of claim 8, wherein the switching part and the plurality of the blocking parts are controlled by a controller to co-operate with one another to supply an inert gas to the inside of the reaction tube.

* * * * *